United States Patent

Yanagihara et al.

[11] Patent Number: 5,999,244
[45] Date of Patent: Dec. 7, 1999

[54] PROJECTION EXPOSURE APPARATUS, METHOD FOR CORRECTING POSITIONAL DISCREPANCY OF PROJECTED IMAGE, AND METHOD FOR DETERMINING IMAGE FORMATION CHARACTERISTIC OF PROJECTION OPTICAL SYSTEM

[75] Inventors: Masamitsu Yanagihara, Zama; Kei Hara; Seiji Miyazaki, both of Yokohama; Hideki Koitabashi, Tokyo; Yoichi Hamashima, Chiba; Hiroshi Kitano, Kawasaki; Yoshiyuki Katamata, Tokyo, all of Japan

[73] Assignee: Nikon Corporation, Tokyo, Japan

[21] Appl. No.: 08/743,096

[22] Filed: Nov. 4, 1996

[30] Foreign Application Priority Data

Nov. 7, 1995 [JP] Japan ..................... 7-313466
Nov. 13, 1995 [JP] Japan ..................... 7-318547
Aug. 30, 1996 [JP] Japan ..................... 8-248809

[51] Int. Cl.$^6$ ................................. H01L 21/027
[52] U.S. Cl. ............................................ 355/53
[58] Field of Search .................... 355/53, 67, 71; 430/5; 250/492.22

[56] References Cited

U.S. PATENT DOCUMENTS 5,581,324 12/1996 Miyai et al. .................. 355/53
5,591,958 1/1997 Nishi et al. ................... 250/205
5,625,436 4/1997 Yanagihara et al. .

FOREIGN PATENT DOCUMENTS 7-183212 7/1995 Japan .
8-55782 2/1996 Japan .
8-55783 2/1996 Japan .
8-55784 2/1996 Japan .

Primary Examiner—Safet Metjahic
Assistant Examiner—Michael Dalakis
Attorney, Agent, or Firm—Oliff & Berridge, PLC

[57] ABSTRACT

Positional discrepancies of images of segmental areas, which are caused by stretching of a substrate in the Y direction, are corrected by changing magnifications of respective projection optical systems and inclinations of parallel plane glass pieces with respect optical axes. After that, positional discrepancies of the images after the correction are accurately detected by using a calibration system for the projection optical systems. Thus it is possible to confirm whether or not the positional discrepancies are accurately corrected. If the correction is insufficient as a result of the confirmation, at least one of correction of the magnifications of the respective projection optical systems and shift of the images projected through the respective projection optical systems onto the substrate is executed again so that amounts of the positional discrepancies are sufficiently small. On the other hand, the positional discrepancy can be easily determined by storing positional information and a detected signal concerning an image formed by a projection optical system in synchronization with a clock, followed by signal processing.

15 Claims, 12 Drawing Sheets

TRANSFER ERROR
 OVERLAP: $\eta = M \times L - L$
 $= (M-1) \times L$

DISCREPANCY: $K = M \times B - B$
 $= (M-1) \times B$

PROJECTION EXPOSURE APPARATUS, METHOD FOR CORRECTING POSITIONAL DISCREPANCY OF PROJECTED IMAGE, AND METHOD FOR DETERMINING IMAGE FORMATION CHARACTERISTIC OF PROJECTION OPTICAL SYSTEM

BACKGROUND OF THE INVENTION

1. Field of the Invention

The present invention relates to a projection exposure apparatus and a method for correcting a positional discrepancy of a projected image, used to expose a liquid crystal display substrate with a pattern by using the projection exposure apparatus. In particular, the present invention relates to a scanning type projection exposure apparatus for illuminating different segmental areas of a pattern area on a mask respectively, and projecting images of the respective segmental areas onto exposure areas (areas to be exposed) on a substrate through a plurality of projection optical systems respectively. Further, the present invention relates to a method for correcting positional discrepancies of images of respective segmental areas, and a method for determining image formation characteristics of projection optical systems.

2. Description of the Related Art

A projection exposure apparatus, in which a photosensitive substrate is exposed with a pattern formed on a mask, by means of transfer through a projection optical system, has been hitherto used in photolithography steps for producing semiconductor elements and liquid crystal display substrates. The projection exposure apparatus includes those of the so-called step-and-repeat system and the mirror projection system.

Recently, it is demanded to increase the areal size of the liquid crystal display substrate, in accordance with which it is desired to enlarge the exposure area of the projection exposure apparatus. A scanning type exposure apparatus provided with a plurality of projection optical systems has been developed as a measure for enlarging the exposure area. Namely, in such a scanning type exposure apparatus, a light beam radiated from a light source is allowed to pass through an optical system comprising, for example, a fly's eye lens to uniformalize its amount of light, and then the light beam is shaped into a desired shape by using a field diaphragm to illuminate a pattern plane on a mask therewith. A plurality of illuminating optical systems each having the arrangement as described above are disposed, and different segmental areas (illumination areas) on a mask are illuminated with light beams radiated from the plurality of the respective illuminating optical systems respectively. The light beams having passed through the mask form images of the pattern on the mask on different projection areas on a glass substrate through the different projection optical systems respectively. The entire plane of the pattern area on the mask is transferred onto the glass substrate by synchronously scanning the mask and the glass substrate with respect to the projection optical systems.

In general, the projection exposure apparatus is used such that a considerable number of layers are repeatedly exposed with original patterns while applying predetermined process treatments to one sheet of the glass substrate. The glass substrate is expanded or contracted (stretched) due to the process treatments (especially due to heating), and it is deformed from its initial state. The conventional exposure apparatus of the step-and-repeat system has only one projection optical system, in which the expansion or contraction (stretching) of the glass substrate may be corrected (corrected with magnification) by changing the projection magnification of the projection optical system, and changing the stop position of a stage during stepping so that a spacing distance between adjacent transferred images is changed. In the case of the exposure apparatus of the mirror projection system, the magnification in a scanning direction may be corrected by continuously changing relative positions of a master plate and a photosensitive substrate with respect to a projection optical system during scanning exposure, and the magnification in a direction perpendicular to the scanning direction may be corrected by changing the magnification of the projection optical system.

However, when the scanning type exposure apparatus provided with a plurality of projection optical systems as described above is used, a continuous pattern on a mask is divided and projected onto a glass substrate by using the plurality of projection optical systems so that divided images are formed without any gap, or they are overlapped with each other by predetermined amounts. Accordingly, the divided images are not continuously formed if there is a large difference between image formation characteristics of the respective projection optical systems as a matter of course, as well as if the mutual positional relationship between the projection optical systems is not in an expected relationship. Therefore, no technique equivalent to those hitherto used can counteract the stretching of the substrate.

In order to overcome such a problem, the present applicant has previously proposed, in Japanese Patent Laid-open No.7-183212, a scanning type exposure apparatus provided with an alignment means for a substrate and a mask, a means for adjusting image formation characteristics of respective projection optical systems, and a means for mutually calibrating the projection optical systems.

According to the scanning type exposure apparatus described above, the positional discrepancy in the X direction (scanning direction) between a substrate and a mask, the positional discrepancy in the Y direction (direction perpendicular to the scanning direction) therebetween, the rotation (rotation about the Z axis perpendicular to the XY plane), and the stretching of the substrate in the X direction can be accurately corrected by moving stages or changing the magnifications of the projection optical systems together with control of movement velocities of the stages while managing all of them by using position sensors such as laser interferometers for monitoring positional displacements of the mask stage and the substrate stage. Further, Japanese Patent Laid-open No.7-183212 discloses a method for counteracting the stretching of a substrate in the Y direction by providing a parallel plane glass piece between a projection optical system and a photosensitive substrate, and rotating the parallel plane glass piece so that the position of an optical axis of the projection optical system is deviated in the Y direction.

However, a first inconvenience arises. Namely, even when the method, which is based on the use of the technique disclosed in Japanese Patent Laid-open No.7-183212, is individually applied to counteract the stretching of the substrate in the X direction and the stretching of the substrate in the Y direction, it is difficult to adjust the image formation position of each of the projection optical systems with a high degree of accuracy in response to actual stretching of the substrate. Especially, it is impossible to correct the stretching of the substrate in the Y direction and the orthogonality error of the substrate caused thereby, while performing management by using position sensors such as laser interferometers.

When the image formation characteristic of each of the projection optical systems is adjusted according to the Japanese Patent Laid-open No.7-183212 described above, for example, it is assumed to use a mask stage comprising driving mechanisms and laser interferometers corresponding to one axis in the X direction and two axes in the Y direction, wherein the mask stage is driven, for example, in the Y direction. If driving amounts brought about by the two driving mechanisms are different from each other due to any cause, and hence different results of detection by the two laser interferometers are obtained, then a result of detection by the laser interferometer in the X direction necessarily changes. In such a situation, a second inconvenience arises. Namely, it is extremely complicated to calculate and determine, in real-time, the position of the mask stage on the basis of the results of detection obtained by the three laser interferometers.

Especially, a problem arises in the case of the use of a scanning type exposure apparatus comprising a mask stage including first reference marks used for positioning, the mask stage being driven by a plurality of driving mechanisms, a plurality of position detectors for detecting positional information on the mask stage, a ]-shaped (like a shape of staple) carriage for carrying the mask stage and a photosensitive substrate thereon, the carriage including second reference marks at positions corresponding to the first reference marks, and photoelectric detectors for detecting photoelectric signals corresponding to images obtained by projecting the first reference marks onto the second reference marks through projection optical systems, because of the following reason. Namely, it is necessary to determine image formation characteristics of the respective projection optical systems on the basis of a position of the mask stage and detected values obtained by the respective photoelectric detectors. Accordingly, it is indispensable to provide a plurality of central processing units (CPU's), and the detecting system depends almost only on the hardware. Consequently, the cost increases, and the system is complicated.

SUMMARY OF THE INVENTION

The present invention has been made in order to dissolve the first inconvenience caused by the conventional technique, an object of which is to provide a method for correcting positional discrepancies which makes it possible to accurately correct positional discrepancies of respective projected images caused by deformation of a substrate.

The present invention has been made in order to dissolve the second inconvenience caused by the conventional technique, another object of which is to provide a method and a projection type exposure apparatus which make it possible to easily determine a position of a mask stage managed by, for example, a plurality of laser interferometers, based on a simple system.

The present invention has been made in order to dissolve the second inconvenience caused by the conventional technique, still another object of which is to provide a method and a projection type exposure apparatus which make it possible to determine image formation characteristics of a plurality of projection optical systems respectively, based on a simple system.

Still another object of the present invention is to provide a method which makes it possible to easily, certainly, and highly accurately determine image formation characteristics of projection optical systems and a position of a mask stage managed by, for example, a plurality of laser interferometers, based on a simple system.

According to a first aspect of the present invention, there is provided a method for correcting positional discrepancies of projected images projected onto exposure areas on a substrate, which is used when the substrate is exposed with an entire plane of a pattern area on a mask by illuminating different segmental areas of the pattern area on the mask respectively, projecting images of the respective segmental areas onto the exposure areas on the substrate through a plurality of projection optical systems provided corresponding to the different segmental areas, and moving the mask and the substrate with respect to the projection optical systems in a predetermined scanning direction at a velocity ratio corresponding to projection magnifications of the projection optical systems, the method comprising:

a first step of detecting amounts of deformation of the substrate including at least an amount of stretching of the substrate in a direction perpendicular to the scanning direction on the basis of a positional relationship between an alignment mark on the mask and an alignment mark on the substrate;

a second step of executing correction of the magnifications of the respective projection optical systems and shift of the images projected onto the substrate through the respective projection optical systems, on the basis of a result of detection obtained in the first step;

a third step of confirming whether or not positional discrepancies and overlap amounts between the images of the mutually adjacent segmental areas projected onto the substrate are within predetermined allowable ranges; and a fourth step of again executing, if the positional discrepancies and the overlap amounts are not within the allowable ranges, at least one of correction of the magnifications of the respective projection optical systems and shift of the images projected onto the substrate through the respective projection optical systems so that both of the positional discrepancies and the overlap amounts are within the allowable ranges.

According to the first aspect of the present invention, the positional discrepancies of the images of the segmental areas, which are caused by at least the stretching of the substrate in the direction perpendicular to the scanning direction, are corrected by the process of the first and second steps. Positional discrepancy amounts as a result of the correction for the positional discrepancies are accurately detected by the process of the third step by using calibration means provided for the respective projection optical systems. Thus it is possible to confirm whether or not the correction for the positional discrepancies is sufficiently performed. If the correction is insufficient as a result of the confirmation, at least one of the correction of the magnifications of the respective projection optical systems and the shift of the images projected onto the substrate through the respective projection optical systems is executed again in the fourth step so that the positional discrepancy amounts become sufficiently small. Therefore, even when the correction of the magnifications, the adjustment for the positional discrepancies of the projected images in the scanning direction, and the adjustment for the positional discrepancies of the projected images in the direction perpendicular to the scanning direction are performed independently from each other, the further adjustment for them makes it possible to confirm whether or not the images formed by the respective projection optical systems are projected onto desired positions.

According to a second aspect of the present invention, there is provided a method for correcting positional discrepancies of projected images projected onto exposure areas on a substrate, which is used when the substrate is exposed with an entire plane of a pattern area on a mask by illuminating different segmental areas of the pattern area on the mask respectively, projecting images of the respective segmental areas onto the exposure areas on the substrate through a plurality of projection optical systems provided corresponding to the different segmental areas, and moving the mask and the substrate with respect to the projection optical systems in a predetermined scanning direction at a velocity ratio corresponding to projection magnifications of the projection optical systems, the method comprising:

a first step of detecting amounts of deformation of the substrate including at least an amount of stretching and an orthogonality error of the substrate in a direction perpendicular to the scanning direction on the basis of a positional relationship between an alignment mark on the mask and an alignment mark on the substrate;

a second step of executing correction of the magnifications of the respective projection optical systems and shift and rotation of the images projected onto the substrate through the respective projection optical systems, on the basis of a result of detection obtained in the first step;

a third step of confirming whether or not positional discrepancies and overlap amounts between the images of the mutually adjacent segmental areas are within predetermined allowable ranges; and a fourth step of again executing, if the positional discrepancies and the overlap amounts are not within the allowable ranges, at least any one of correction of the magnifications of the respective projection optical systems and shift and rotation of the images projected onto the substrate through the respective projection optical systems so that both of the positional discrepancies and the overlap amounts are within the allowable ranges.

According to the second aspect of the present invention, the positional discrepancies of the images of the segmental areas, which are caused by at least the stretching and the orthogonality error of the substrate in the direction perpendicular to the scanning direction, are corrected by the process of the first and second steps. Positional discrepancy amounts as a result of the correction for the positional discrepancies are accurately detected by the process of the third step by using calibration means provided for the respective projection optical systems. Thus it is possible to confirm whether or not the correction for the positional discrepancies is sufficiently performed. If the correction is insufficient as a result of the confirmation, at least any one of the correction of the magnifications of the respective projection optical systems and the shift and the rotation of the images projected onto the substrate through the respective projection optical systems is executed again in the fourth step so that the positional discrepancy amounts become sufficiently small. According to this method, even if the orthogonality error and the stretching of the substrate in the direction perpendicular to the scanning direction take place, it is possible to accurately correct the positional discrepancies of the images of the segmental areas caused by the orthogonality error and the stretching. In addition, even when the correction of the magnifications, the adjustment for the positional discrepancies of the projected images in the scanning direction, and the adjustment for the positional discrepancies of the projected images in the direction perpendicular to the scanning direction are performed independently from each other, the further adjustment for them makes it possible to confirm whether or not the images formed by the respective projection optical systems are projected onto desired positions.

According to a third aspect of the present invention, there is provided a projection type exposure apparatus wherein first and second members are positioned by projecting, through a projection optical system, a first positioning reference mark formed on the first member onto a second reference mark formed on the second member at a position corresponding to the first reference mark, and observing a projected image thereof, the projection type exposure apparatus comprising:

a plurality of driving mechanisms for moving the first member on a plurality of axes;

a plurality of position detectors for detecting pieces of positional information on the first member;

a photoelectric detector for outputting a photoelectric signal corresponding to the image of the first reference mark projected onto the second reference mark;

a clock signal generator for generating a clock signal to define constant time intervals;

a plurality of storing means provided corresponding to each of the plurality of position detectors;

a storage control means for storing each of the pieces of positional information detected by the position detectors in each of the corresponding storing means in synchronization with the clock signal; and a computing means for determining an image formation characteristic of the projection optical system on the basis of the pieces of positional information on the first member stored in the plurality of storing means and the photoelectric signal outputted from the photoelectric detector.

According to the third aspect of the present invention, when the first member like a mask or substitute is driven by the driving mechanisms, the plurality of position detectors detect pieces of positional information on the first member. At this time, the clock signal generator generates the clock signal to define the constant time intervals. The storage control means stores each of the pieces of positional information detected by the position detectors in each of the corresponding storing means in synchronization with the clock signal. After that, the computing means determines positions of the first member detected by the plurality of position detectors on the basis of the pieces of positional information stored in the plurality of storing means. Therefore, when the first member is moved to scan the first reference mark across an field area of the projection optical system, the plurality of pieces of positional information can be once stored in each of the storing means in synchronization with the clock signal to define the constant time intervals, and processed later on. Accordingly, it is possible to determine the position of the first member by using the computing means including single CPU (central processing unit).

The projection type exposure apparatus according to the third aspect of the present invention may use a plurality of the photoelectric detectors and further comprises a plurality of second storing means provided corresponding to each of the plurality of photoelectric detectors and a second storage control means for storing each of photoelectric signals in each of the corresponding second storing means in synchronization with the clock signal; wherein the computing means determines the image formation characteristic of the projection optical system on the basis of the pieces of positional information stored in the storing means and the photoelectric signals corresponding to the pieces of positional information, stored in the second storing means.

According to the foregoing preferred embodiment of the third aspect of the present invention, each of the pieces of positional information detected by the position detectors is stored in each of the corresponding storing means by the aid of the storage control means. Simultaneously, each of the photoelectric signals is stored in each of the second storing means by the aid of the second storage control means. After that, the computing means determines the image formation characteristic of the projection optical system on the basis of the pieces of positional information stored in the plurality of storing means and the photoelectric signals corresponding to the pieces of positional information, stored in the second storing means. Therefore, when the first member is moved to scan the first reference mark across the field area of the projection optical system, the plurality of pieces of positional information can be once stored in each of the storing means in synchronization with the clock signal to define the constant time intervals, and processed later on. Moreover, the photoelectric signals from the plurality of photoelectric detectors can be also once stored in each of the plurality of second storing means, and processed later on. Accordingly, it is possible to determine the image formation characteristic of the projection optical system by using the computing means including single CPU (central processing unit).

According to a fourth aspect of the present invention, there is provided a method for determining an image formation characteristic of a projection optical system, comprising the steps of:

irradiating a first member including a first positioning reference mark thereon, with a light beam;

scanning the first reference mark across a field area of the projection optical system by moving the first member with respect to the projection optical system so that an image of the first reference mark is projected through the projection optical system onto a second reference mark formed on a second member;

detecting, during the scanning, positions of the first member by using a plurality of detectors, and storing detected positional information in synchronization with a clock signal;

detecting, during the scanning, the image of the first reference mark projected onto the second reference mark, and storing a detected signal; and determining the image formation characteristic of the projection optical system on the basis of the stored positional information on the first member and the detected signal concerning the image of the first reference mark.

According to the method of the fourth aspect of the present invention, a plurality of pieces of positional information can be once stored in each of storing means in synchronization with the clock signal to define constant time interval, and processed later on. Accordingly, it is possible to determine the positions of the first member by using single CPU (central processing unit). In a preferred embodiment of this method, a plurality of the same projection optical systems as that defined above may be used to detect signals concerning images of the first reference mark by using the plurality of detectors corresponding to a number of the projection optical systems, and the signals from the plurality of detectors may be stored in synchronization with the clock signal respectively so that image formation characteristics of the projection optical systems are determined on the basis of the positional information on the first member and the detected signals concerning the images of the first reference mark. According to this preferred embodiment, the plurality of detected signals can be also once stored in synchronization with the clock signal, and processed later on. Accordingly, it is possible to determine the image formation characteristics of the projection optical systems by using single CPU.

According to a fifth aspect of the present invention, there is provided a method for determining an image formation characteristic of a projection optical system, comprising the steps of:

irradiating a first member including a first positioning reference mark thereon, with a light beam;

scanning the first reference mark across a field area of the projection optical system by moving the first member with respect to the projection optical system so that an image of the first reference mark is projected through the projection optical system onto a second reference mark formed on a second member;

detecting, during the scanning, positions of the first member by using a plurality of detectors, and storing detected positional information in synchronization with a clock signal;

detecting, during the scanning, the image of the first reference mark projected onto the second reference mark in synchronization with the clock signal, and storing a detected signal;

appropriately dividing, on time base, the detected signal concerning the image of the first reference mark to perform Fourier transform so that mark centers, at which the image of the first reference mark overlaps the second reference mark, are determined for each of divided areas on the basis of a result of the Fourier transform and a designed value; and simply averaging data on positions of the mark centers for the respective divided areas to determine a true position of the mark center on the basis of which a positional discrepancy of the projected image is determined.

According to the fifth aspect of the present invention, when the positional discrepancy of the projected image of the first reference mark is determined, each of the photoelectric signals, which is stored in synchronization with the clock signal to define constant time intervals, is appropriately divided on time base to perform the Fourier transform. Accordingly, arctangents of real and imaginary parts, which are obtained by the Fourier transform, are used to determine phase angles for each of the divided areas. The mark centers of each of the divided areas can be mechanically determined on the basis of the phase angles and the designed values without being affected by a noise or the like. The data on the positions of the mark centers for the respective divided areas are simply averaged to determine the true position of the mark center. The discrepancy amount on time base between the true position of the mark center and the designed value is converted into a positional discrepancy amount by using the positional information stored simultaneously with the detected signals in synchronization with the clock signal to define the constant time intervals. Thus the positional discrepancy of the projected image can be determined with a high degree of accuracy.

In a preferred embodiment of the method according to the fifth aspect of the present invention, the true position of the mark center may be determined such that the data on the positions of the mark centers for the respective divided areas are determined on the basis of a weighted average depending on signal intensities. According to this preferred embodiment, the data on the positions of the mark centers for the respective divided areas are determined on the basis of the weighted average depending on the signal intensities. Accordingly, the weighted average is obtained such that a larger weight is given to data on a position of a mark center concerning a divided area having a large signal intensity, while a smaller weight is given to data on a position of a mark center concerning a divided area having a small signal intensity. Thus the true position of the mark center can be determined with a high degree of accuracy as compared with the simple average. Consequently, the positional discrepancy of the projected image can be determined with a high degree of accuracy.

In another preferred embodiment of the method according to the fifth aspect of the present invention, the true position of the mark center may be determined such that a width of a window, which determines the divided area, is changed for each of the divided areas depending on a velocity of the first member obtained on the basis of the positional information. According to this preferred embodiment, the true position of the mark center is determined such that the width of the window, which determines the divided area, is changed for each of the divided areas depending on the velocity of the first member obtained on the basis of the positional information. Accordingly, it is unnecessarily indispensable to move the first member at a uniform velocity in order to incorporate the signals. The signals can be incorporated even during acceleration or deceleration. Thus it is possible to shorten the time required to determine the image formation characteristic of the projection optical system.

DETAILED DESCRIPTION OF PREFERRED EMBODIMENTS

Embodiments of the present invention will be explained below with reference to FIGS. 1 to 14.

First Embodiment

Figure 1:
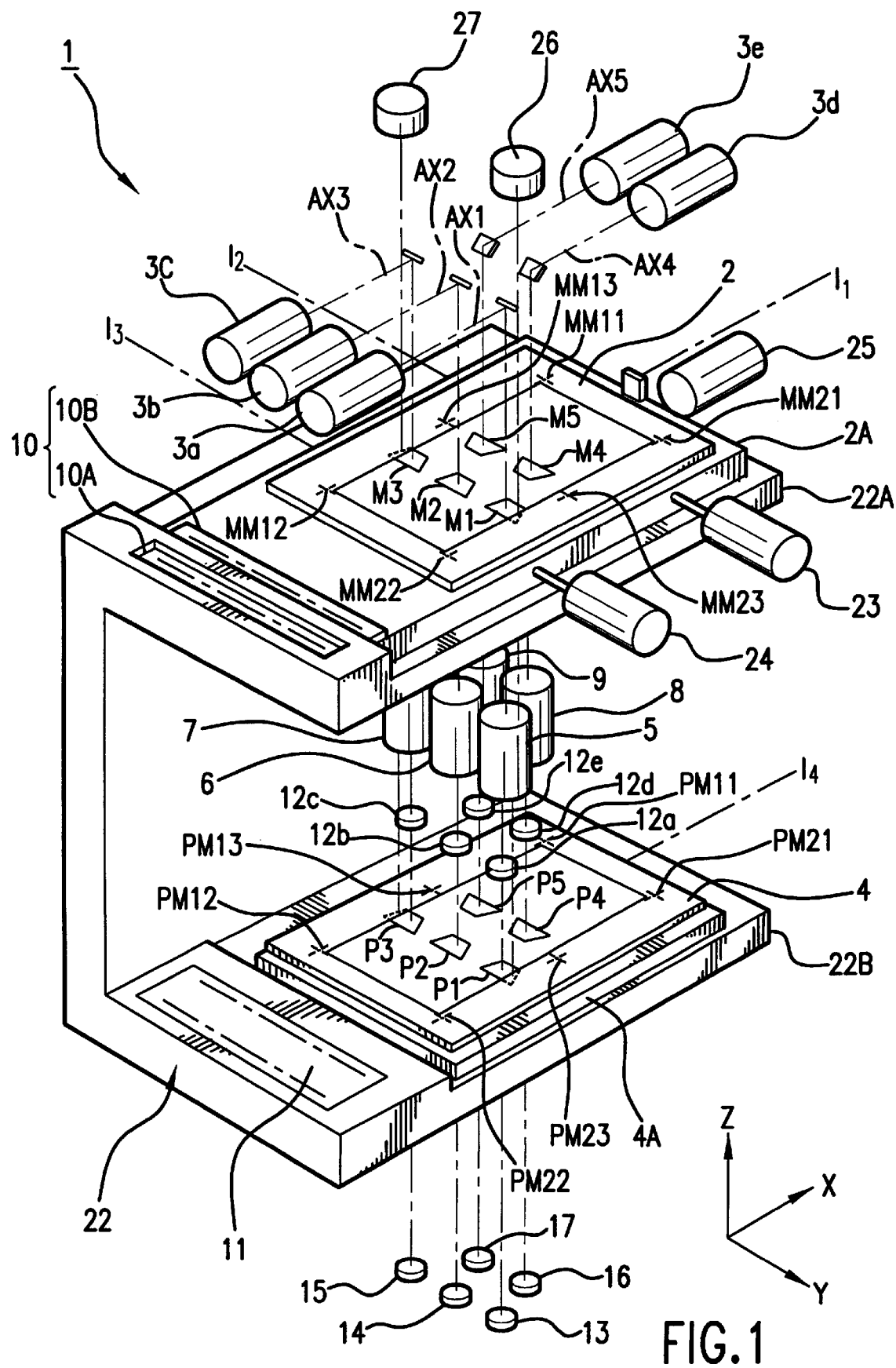
FIG. 1 shows a perspective view illustrating a schematic arrangement of a projection exposure apparatus according to an embodiment of the present invention.

FIG. 1 schematically shows an entire arrangement of a projection exposure apparatus 1 according to an embodiment to carry out a method for correcting positional discrepancies in accordance with the present invention. The projection exposure apparatus 1 is a scanning type exposure apparatus capable of transferring an erecting image of 1× magnification.

The projection exposure apparatus 1 comprises a plurality of (five, in this embodiment) illuminating optical systems 3a to 3e for illuminating different segmental areas M1 to M5 on a mask 2 with illuminating light beams shaped to have predetermined shapes by unillustrated field diaphragms, and a plurality of (five, in this embodiment) projection optical systems 5 to 9, provided corresponding to the illuminating optical systems 3a to 3e, for projecting a pattern on the mask 2 onto a photosensitive substrate 4. An entire plane of a pattern area on the mask 2 can be transferred onto the photosensitive substrate 4 by scanning a carriage 22 having a ]-shaped (like a shape of staple) cross section, on which the mask 2 and the photosensitive substrate 4 are carried, in its longitudinal direction, i.e., in a direction of the X axis (hereinafter referred to as "scanning direction", if necessary) with respect to the illuminating optical systems 3a to 3e and the projection optical systems 5 to 9. The projection exposure apparatus 1 comprises five photoelectric detectors 13 to 17 arranged at corresponding positions under the carriage 22 respectively, for measuring patterns projected onto the photosensitive substrate 4 through the projection optical systems 5 to 9.

Figure 2:
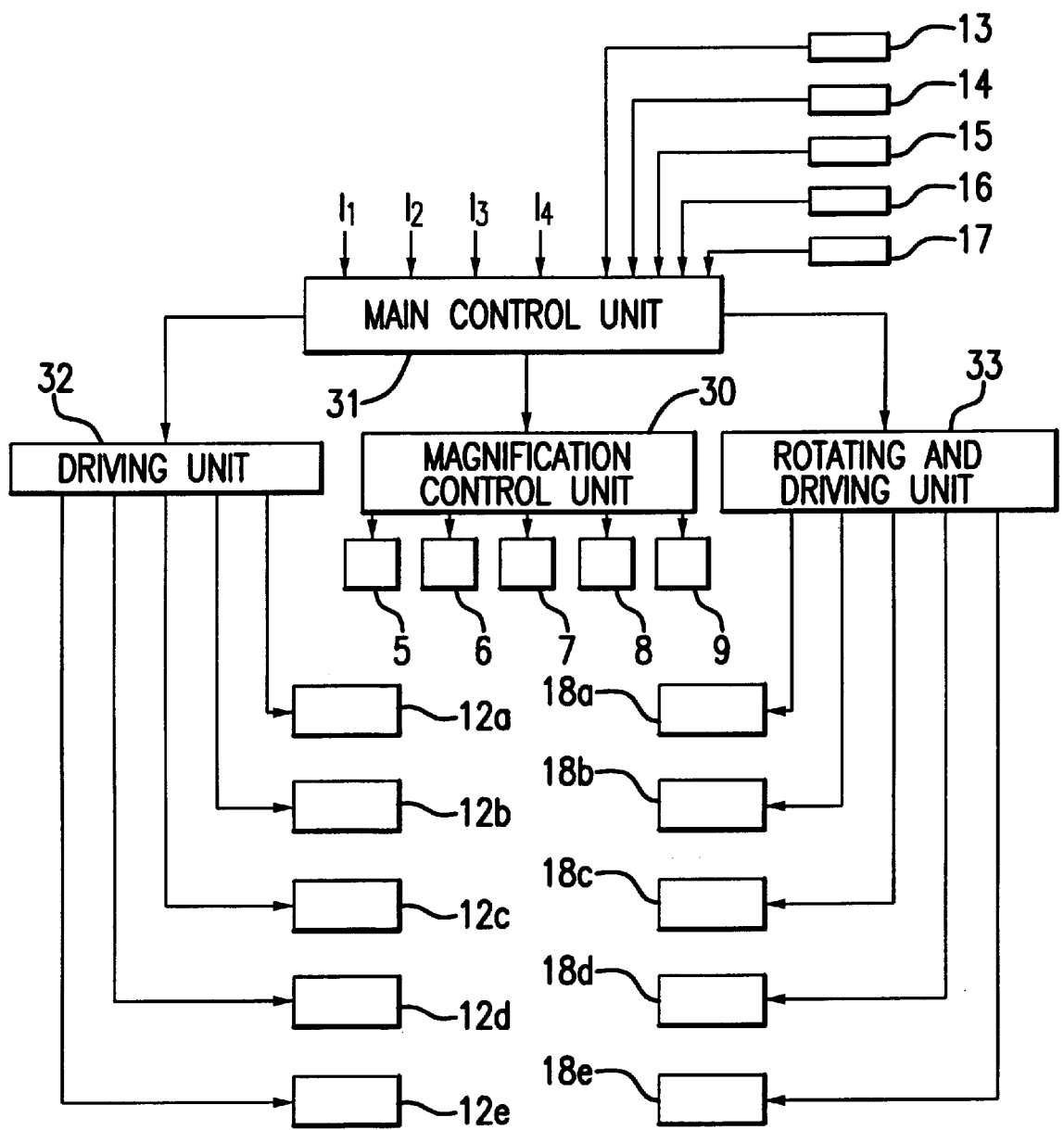
FIG. 2 shows a block diagram illustrating a schematic arrangement of a control system concerning positional discrepancies of respective projected images obtained by using the apparatus shown in FIG. 1.

The projection optical systems 5 to 9 are connected to a magnification control unit 30 (not shown in FIG. 1, see FIG. 2). The projection magnification is changed, for example, by adjusting a pressure of gas charged between optical elements of each of the projection optical systems. Parallel plane glass pieces 12a to 12e are arranged in optical paths between the respective projection optical systems 5 to 9 and the photosensitive substrate 4 respectively. Optical axes of the respective projection optical systems are shifted by changing angles of the parallel plane glass pieces 12a to 12e with respect to the optical axes AX1 to AX5 so that projection positions of images (projection areas) P1 to P5 of the segmental areas M1 to M5 are changed on the photosensitive substrate 4 (this operation will be described in detail later on). In this embodiment, the projection optical systems 5 to 9 contain image-rotating systems 18a to 18e (not shown in FIG. 1, see FIG. 2) such as Dove prisms for rotating, on the plane of the photosensitive substrate 4, the images P1 to P5 projected onto the photosensitive substrate 4 through the respective projection optical systems. Incoming and outgoing optical axes of the Dove prism are allowed to coincide with the optical axis AX of the projection optical system, and the Dove prism is rotated about the optical axis as a center. Thus the image is rotated on the plane of the photosensitive substrate 4 in an amount corresponding to an angle which is twice an angle of rotation of the prism. Accordingly, the orthogonality error is corrected. Namely, in this embodiment, the discrepancy amount of each of the images measured by each of the five photoelectric detectors 13 to 17 can be adjusted by changing the projection magnification and the projection position of the image on the photosensitive substrate 5, and rotating the image.

FIG. 2 shows an arrangement of a control system relevant to adjustment for the discrepancy amount of each of the images in the exposure apparatus 1. The control system comprises a main control unit 31 as a central component. Laser interferometers $I_1, I_2, I_3, I_4$ described later on, and the five photoelectric detectors 13 to 17 are connected to the input side of the main control unit 31. A driving unit 32, the magnification control unit 30, and a rotating and driving unit 33 are connected to the output side of the main control unit 31. The driving unit 32 has a function to individually change the angles of the parallel plane glass pieces 12a to 12e with respect to the optical axes AX1 to AX5. The magnification control unit 30 adjusts the projection magnifications of the projection optical systems 5 to 9 as described above. The rotating and driving unit 33 independently rotates and drives the image-rotating systems 18a to 18e.

With reference to FIG. 1 again, the projection optical systems 5 to 9 are arranged in two rows, one row comprising the projection optical systems 5, 6, 7, and the other row comprising the projection optical systems 8, 9. The projection optical systems 5 to 9 are arranged in a zigzag configuration so that exposure images of adjacent patterns are overlapped with each other in a predetermined amount. Accordingly, the pattern on the mask 2 is divided by the projection optical systems 5 to 9, and its image is formed at a ratio of 1:1 on the photosensitive substrate 4.

The mask 2 is held horizontally on a mask stage 2A carried on a top plate 22A of the carriage 22. Driving units 23, 24, 25 such as motors are attached to the mask stage 2A so that the mask stage 2A is movable on the carriage 22 with respect to a photosensitive substrate holder 4A described later on in X, Y, θ directions (for example, the scanning direction is defined as the X direction in the horizontal plane, a direction perpendicular thereto is defined as the Y direction, and a rotational direction about the Z axis perpendicular to the XY plane is defined as the θ direction). Laser interferometers $I_1, I_2, I_3$ (only length-measuring beams are shown) are provided at one position in the scanning direction (X direction) and two positions in the Y direction to measure the shift in the Y direction and the θ component so that movement positions in the X, Y, θ directions may be measured.

The photosensitive substrate 4 is held horizontally on the photosensitive substrate holder 4A secured to a bottom plate 22B of the carriage 22. The position of the photosensitive substrate holder 4A in the scanning direction, i.e., the position of the carriage 22 in the scanning direction can be measured by a laser interferometer $I_4$ (only length-measuring beam is shown).

A movable mark plate 10B on the side of the mask extends in a direction substantially perpendicular to the scanning direction at one end of the mask stage 2A in the scanning direction. The movable mark plate 10B on the side of the mask is arranged on a plane substantially identical to the plane of the mask 2.

One end of the top plate 22A of the carriage 22 in the X direction forms a terrace with its top surface raised by one step. A fixed mark plate 10A on the side of the mask, which extends in the Y direction, is arranged on the top surface of the terrace on a plane substantially identical to the plane of the mask 2 and the movable mark plate 10B on the side of the mask.

One end of the bottom plate 22B of the carriage 22 forms a terrace with its top surface raised by one step. A fiducial mark plate 11 on the side of the photosensitive substrate is arranged on a plane substantially identical to the plane of the photosensitive substrate 4, at a position opposing to the position of arrangement of the fixed mark plate 10A on the side of the mask and the movable mark plate 10B on the side of the mask.

The exposure apparatus 1 can measure image formation characteristics (for example, distortions) of the projection optical systems 5 to 9 by using the fixed mark plate 10A on the side of the mask, the movable mark plate 10B on the side of the mask, and the fiducial mark plate 11 on the side of the photosensitive substrate.

Alignment microscopes 26, 27 are installed above the mask 2 and just over the projection optical systems 5, 7 arranged at the outermost positions in the direction perpendicular to the scanning direction. The alignment microscopes 26, 27 are provided for measuring discrepancy amounts between images of alignment marks on the photosensitive substrate 4, formed on the mask 2 by the projection optical systems 5, 7 (as described later on) and alignment marks on the mask 2 (as described later on). The alignment microscopes 26, 27 are set to have a relatively wide field, and they also serve as observing systems during calibration with the fiducial mark plate 10 on the side of the mask and the fiducial mark plate 11 on the side of the photosensitive substrate.

Figures 3A, 3B:
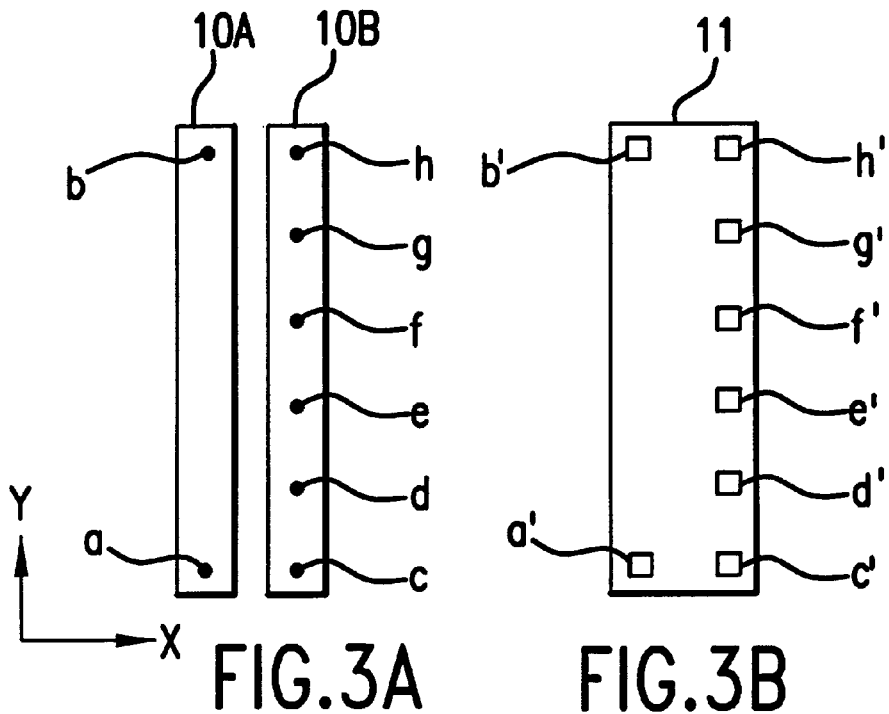
FIG. 3A shows an exemplary arrangement of measuring marks on a fiducial mark plate disposed on a side of a mask.
FIG. 3B shows an exemplary arrangement of measuring marks on a fiducial mark plate disposed on a side of a photosensitive substrate.

FIG. 3 exemplarily shows the fiducial mark plate 11 on the side of the photosensitive substrate, and the fiducial mark plate 10 on the side of the mask, i.e., the fixed mark plate 10A on the side of the mask and the movable mark plate 10B on the side of the mask. The fixed mark plate 10A on the side of the mask, which is included in the fiducial mark plate 10 on the side of the mask (FIG. 3A) and fixed to the carriage 22, is formed such that at least one or more measuring marks are embraced in each of exposure areas of the outermost projection optical systems 5, 7 (only one mark a and b for each of them are shown in FIG. 3). The movable mark plate 10B on the side of the mask is formed such that at least two or more measuring marks c to h are embraced in an exposure area of each of the projection optical systems 5 to 9. On the other hand, the fiducial mark plate 11 on the side of the photosensitive substrate, which forms a pair with the fiducial mark plate 10 on the side of the mask, has measuring marks a' to h' integrally formed with a high degree of accuracy so that the measuring marks a' to h' correspond to the measuring marks a to h of the both of the fixed mark plate 10A on the side of the mask and the movable mark plate 10B on the side of the mask respectively. It is preferable for the projection optical system 5 that the position of the measuring mark a in the Y direction in FIG. 3 is identical or approximately near to the position of the measuring mark c in the Y direction in FIG. 3. The measuring marks b and h are preferably disposed in the same manner as described above.

Calibration for Projection Optical Systems

Next, a method for calibrating the projection optical systems 5 to 9 of the exposure apparatus 1 constructed as described above will be explained.

Figure 4:
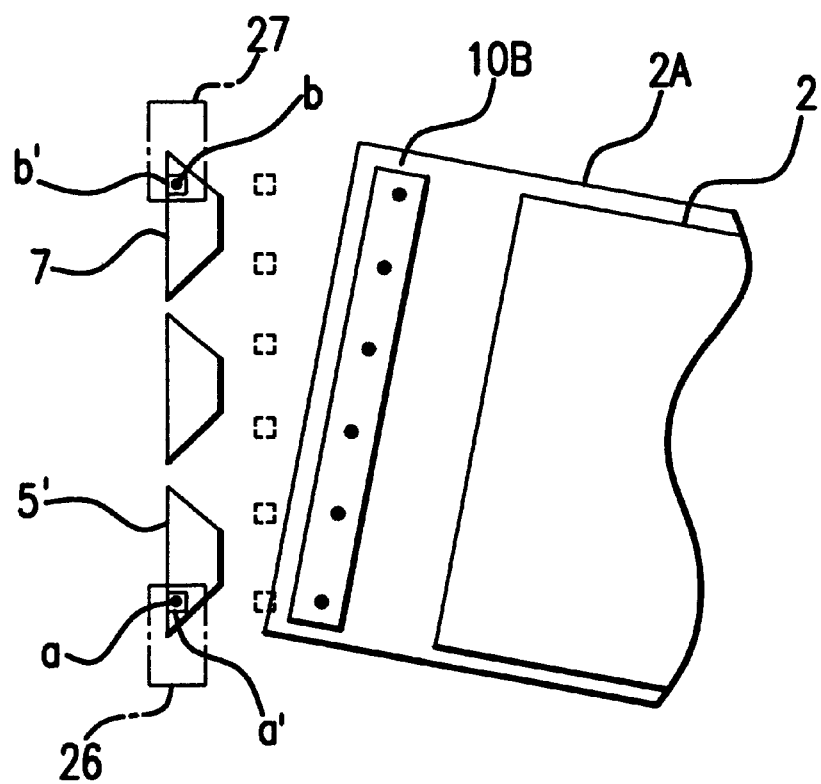
FIG. 4 explains a method for calibrating projection optical systems (lenses) disposed on outer sides, of a plurality of projection optical systems.
Figure 5A:
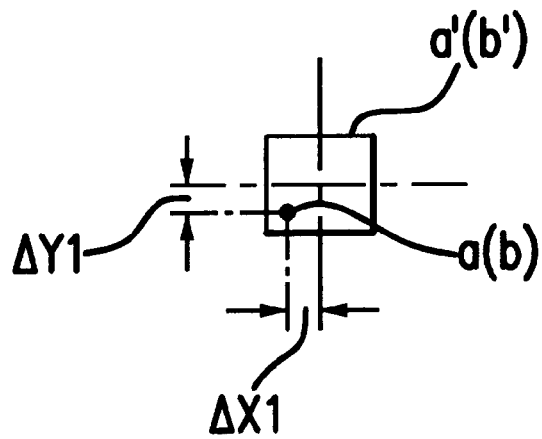
FIG. 5A shows a state before discrepancy amounts between a projected image and a measuring mark are corrected.
Figure 5B:
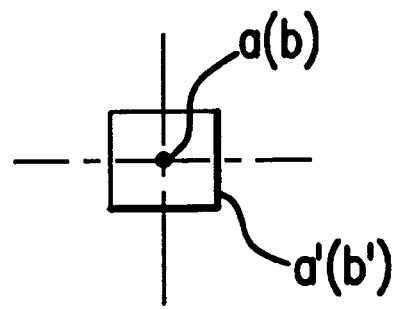
FIG. 5B shows a state after the discrepancy amounts between the projected image and the measuring mark are corrected.

At first, calibration is performed for the outer projection optical systems 5, 7 by using the fiducial mark plate 11 on the side of the photosensitive substrate and the fixed mark plate 10A on the side of the mask. Namely, as shown in FIG. 4, the carriage 22 is moved with respect to the projection optical systems 5, 7 until the measuring mark a on the fixed mark plate 10A on the side of the mask and the measuring mark a, on the fiducial mark plate 11 on the side of the photosensitive substrate come to conjugate positions. The measuring mark a' is projected onto the measuring mark a through the projection optical system 5 (in FIG. 4, an image projected through the projection optical system 5 onto the photosensitive substrate 4 is indicated by a reference numeral 5'). As shown in FIG. 5A, the alignment microscope 26 is used to measure discrepancy amounts $\Delta x_1$, $\Delta y_1$ between the projected image and the measuring mark a. The inclination of the parallel plane glass piece 12a with respect to the optical axis $\Delta X$ is changed, and thus the image is shifted to move the image of the measuring mark a' so that the discrepancy amounts $\Delta x_1$, $\Delta y_1$ are zero as shown in FIG. 5B. In the same manner as described above, the alignment microscope 27 and the measuring marks b, b' are used to adjust the projection optical system 7 (in FIG. 4, an image projected through the projection optical system 7 onto the photosensitive substrate 4 is indicated by a reference numeral 7').

Figure 6:
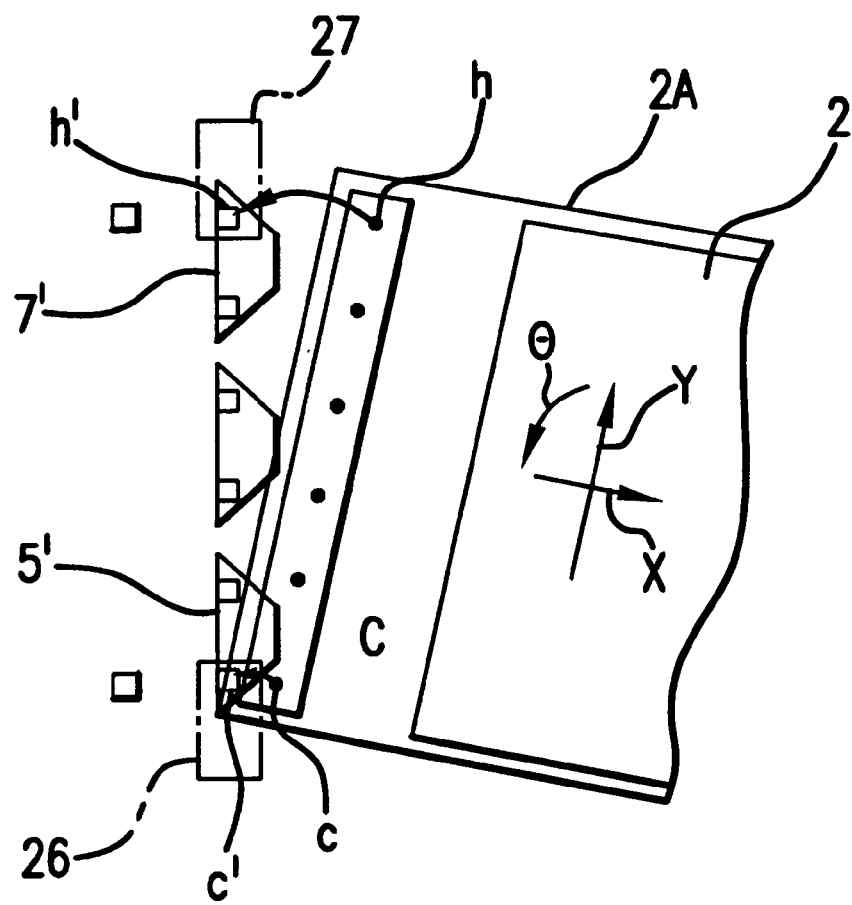
FIG. 6 explains a method for calibrating a movable mark plate disposed on the side of the mask.

Next, as shown in FIGS. 6 and 7, calibration is performed for the movable mark plate 10B on the side of the mask. Namely, the carriage 22 is moved with respect to the projection optical system 5 so that the measuring mark c on the movable mark plate 10B on the side of the mask and the measuring mark c' on the fiducial mark plate 11 on the side of the photosensitive substrate are at conjugate positions. At this time, carriage 22 is moved so that the measuring mark h on the movable mark plate 10B on the side of the mask and the measuring mark h' on the fiducial mark plate 11 on the side of the photosensitive substrate are conjugate in relation to the projection optical system 7.

The measuring mark c' is projected onto the measuring mark c through the projection optical system 5 having been adjusted with the measuring mark a. The alignment microscope 23 is used to measure discrepancy amounts $\Delta x_2$, $\Delta Y_2$ between the projected image and the measuring mark c. In the same manner as described above, discrepancy amounts $\Delta X_3$, $\Delta y_3$ between the measuring marks h and h' are measured. The mask stage 2A is moved in the X, Y, and $\theta$ directions by using the driving units 23 to 25 so that the discrepancy amounts $\Delta x_2$, $\Delta y_2$, $\Delta X_3$, $\Delta y_3$ are minimized respectively.

The measurement of the discrepancy amount explained above is performed in accordance with an image processing technique by using, for example, cross-shaped marks as the alignment marks. The distance between the marks can be easily calculated according to the picture element pitch of a CCD camera (not shown) and the magnification of the optical system.

Figure 7B:
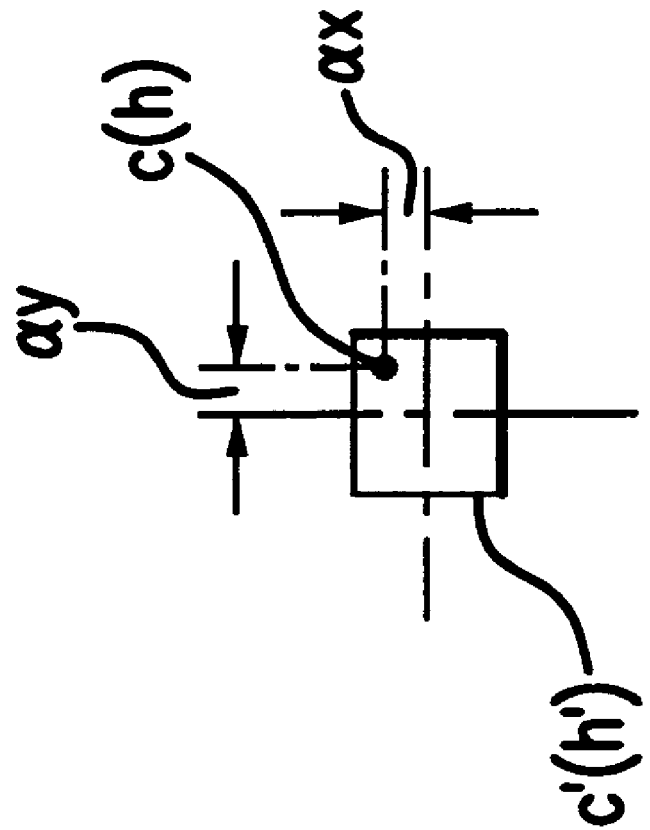
FIG. 7B explains the method for calibrating the movable mark plate disposed on the side of the mask, illustrating attachment errors of a fiducial mark plate disposed on the side of the photosensitive substrate with respect to a fixed mark plate disposed on the side of the mask.
Figure 7A:
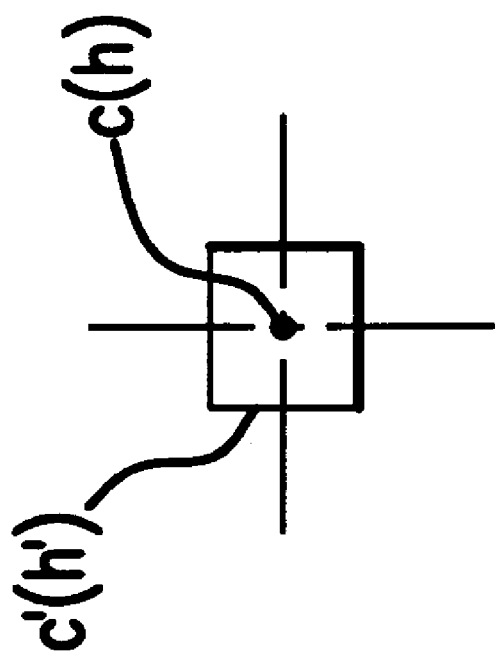
FIG. 7A explains the method for calibrating the movable mark plate disposed on the side of the mask, illustrating a state in which any discrepancy amount between measuring marks disposed on the sides of the mask and the photosensitive substrate is zero.

The discrepancy amounts between the measuring marks c, c' and between the measuring marks h, h' disappear as shown in FIG. 7A by moving the mask stage 2A as described above. However, if there is any error with respect to a designed value in attachment, to the carriage 22, of the fixed mark plate 10A on the side of the mask or the fiducial mark plate 11 on the side of the photosensitive substrate, the error is included in the position of the movable mark plate 10B on the side of the mask as it is. For this reason, if there is any error, error amounts $\alpha x$, $\alpha y$ of the fiducial mark plate 11 on the side of the photosensitive substrate with respect to the fixed mark plate 10A on the side of the mask are previously measured. The error amounts $\alpha x$, $\alpha y$ are added as offsets to movement amounts as shown in FIG. 7B when the mask stage 2A is moved so that the error is corrected.

Figure 8A:
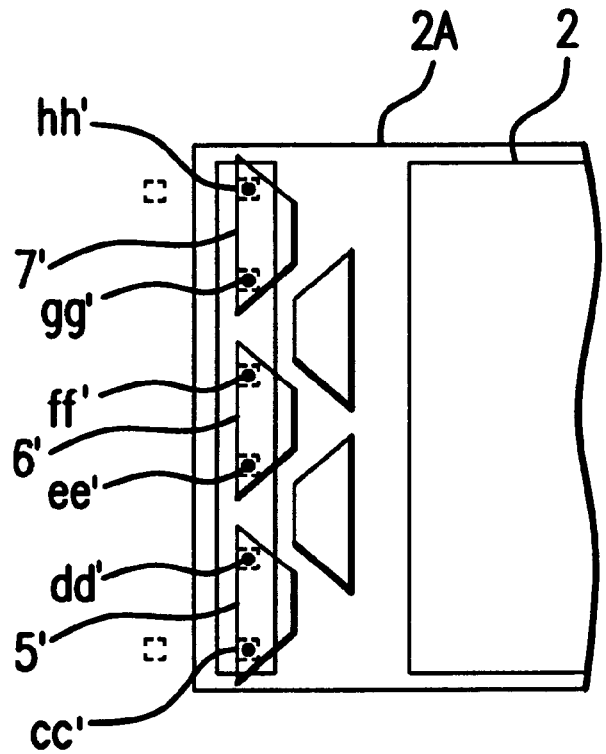
FIG. 8A shows a method for adjusting projection optical systems disposed in a first row.
Figure 8B:
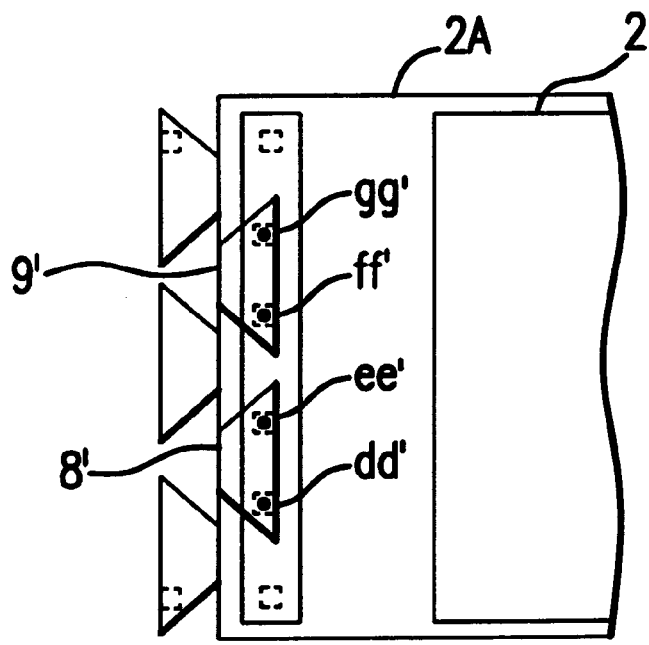
FIG. 8B shows a method for adjusting projection optical systems disposed in a second row.

Calibration for the movable mark plate 10B on the side of the mask as a reference is thus completed. Next, as shown in FIGS. 8A and 8B, the projection optical systems 5 to 9 are calibrated (in FIGS. 8A and 8B, images projected through the projection optical systems 5 to 9 onto the photosensitive substrate 4 are indicated by reference numerals 5' to 9' respectively). In this procedure, discrepancy amounts between the respective measuring marks c to h on the calibrated movable mark plate 10B on the side of the mask and the respective measuring marks c' to h' on the fiducial mark plate 11 on the side of the photosensitive substrate for the projection optical systems 6, 8, 9 as a matter of course, as well as for the outer projection optical systems 5, 7.

As shown in FIG. 8A, the measurement is performed in a system in which the light beams coming from the illuminating optical systems 3a to 3c are transmitted through the respective measuring marks c to h on the movable mark plate 10B on the side of the mask and the projection optical systems 5 to 7, and the light beams are transmitted through the respective measuring marks c' to h' on the fiducial mark plate 11 on the side of the photosensitive substrate to arrive at the photoelectric detectors 13 to 15. At first, the mask stage 2A is scanned in the XY directions to measure the discrepancy amounts on the basis of changes in amounts of transmitted light received by the photoelectric detectors 13 to 15 corresponding to positions of the mask stage 2A. Thus correction is performed so that the continuity of the images projected by the projection optical systems 5 to 7 is optimized.

Namely, the amounts of transmitted light are monitored by the photoelectric detectors 13 to 15 while monitoring the position of the mask stage 2A by the laser interferometers $I_1$, $I_2$, $I_3$. Predetermined signal processing is performed in accordance with change in signal caused by overlap of the both marks (the respective measuring marks on the movable mark plate 10B on the side of the mask and the respective measuring marks on the fiducial mark plate 11 on the side of the photosensitive substrate). Accordingly, positional overlap centers for the both marks through the respective projection optical systems are determined. Thus the discrepancy amounts are determined on an interferometer basis. The discrepancy amounts are corrected by shifting the optical axes $AX_1$ to $AX_3$ by using the parallel plane glass pieces 12a to 12c.

Next, as shown in FIG. 8B, the measurement is performed in a system in which the light beams coming from the illuminating optical systems 3d, 3e are transmitted through the respective measuring marks d to g on the movable mark plate 10B on the side of the mask and the projection optical systems 8, 9, and the light beams are transmitted through the respective measuring marks d' to g' on the fiducial mark plate 11 on the side of the photosensitive substrate to arrive at the photoelectric detectors 16, 17. The mask stage 2A is scanned to measure the discrepancy amounts on the basis of changes in amounts of transmitted light received by the photoelectric detectors 16, 17 corresponding to positions of the mask stage 2A. The discrepancy amounts are corrected so that the continuity of the images projected by the projection optical systems 8, 9 is optimized. The correction can be performed to make adjustment in the same manner as performed for the projection optical systems 5 to 7. Namely, the optical axes $AX_4$, $AX_5$ of the projection optical systems 8, 9 are shifted by using the parallel plane glass pieces 12d, 12e. Thus mutual positional adjustment for the images concerning the respective projection optical systems 5 to 9 (correction of the positional discrepancy amounts) has been executed on the basis of the measuring marks a' to h' on the fiducial mark plate 11 and the measuring marks a to h on the movable mark plate 10B.

Alignment Method for Mask and Photosensitive Substrate

Next, an alignment method for the mask 2 and the photosensitive substrate 4 will be explained.

As shown in FIG. 1, alignment marks MM11, MM21, MM12, MM22, and PM11, PM21, PM12, PM22 are provided on the photosensitive substrate 4 and the mask 2. It is possible to detect differences in positions (hereinafter referred to as "differences") between MM11 and PM11, between MM21 and PM21, between MM12 and PM12, and between MM22 and PM22 by using the alignment microscopes 26, 27. It is easy for the arrangement of this apparatus to provide more alignment marks such as MM13, MM23, PM13, and PM23 in the scanning direction.

At first, the carriage 22 is moved to a position at which the differences between the alignment marks MM11 and PM11 and between MM21 and PM21 to perform measurement in the X, Y directions. It is defined that the differences between the marks MM11 and PM11 in the X, Y directions are $\Delta D11X$ and $\Delta D11Y$ respectively, and the differences between the marks MM21 and PM21 in the X, Y directions are $\Delta D21X$ and $\Delta D21Y$ respectively.

Next, the carriage 22 is moved to a position at which the differences between the marks MM12 and PM12 and between MM22 and PM22 to perform measurement in the X, Y directions. It is defined that the differences between the marks MM12 and PM12 in the X, Y directions are $\Delta D12X$ and $\Delta D12Y$ respectively, and the differences between the marks MM22 and PM22 in the X, Y directions are $\Delta D22X$ and $\Delta D22Y$ respectively.

Now the X shift, the Y shift, the rotation, the magnification (stretching ratio) in the X direction, the magnification (stretching ratio) in the Y direction, and the orthogonality concerning the mask 2 or the photosensitive substrate 4 can be calculated by means of a computing operation, for example, by means of so-called least square approximation provided that three or more values of the resultant X components (for example, $\Delta D11X$, $\Delta D21X$, $\Delta D12X$, $\Delta D22X$) and the resultant Y components (for example, $\Delta D11Y$, $\Delta D21Y$, $\Delta D12Y$, $\Delta D22Y$) respectively are available. Those known as such a calculating method include, for example, EGA (enhanced global alignment) measurement described in U.S. Pat. No. 4,780,617. This United States Patent document is incorporated herein by reference.

Thus respective amounts of error are determined. As for the X shift, Y shift, and the rotation, the mask 2 and the photosensitive substrate 4 are positioned by driving the driving units 23, 24, 25 while monitoring information from the laser interferometers $I_1, I_2, I_3$ so that the amounts of error are corrected.

It is assumed that the determined magnification in the Y direction is $M_1$, and the determined magnification in the X direction is $M_2$. The magnifications of the projection optical systems 5 to 9 are changed by $M_1$. A difference between $M_1$ and $M_2$ can be counteracted, for example, with a difference in movement velocity between the mask 2 and the photosensitive substrate 4 during actual exposure such that the movement velocity of the mask stage 2A is accelerated or decelerated. Thus the magnification can be changed by $M_1$ in the Y direction and by $M_2$ in the X direction. Namely, the stretching ratio in the X direction can be corrected by changing the magnification of the projection optical system and shifting the mask stage 2A in the X direction during scanning exposure on the basis of the positional information obtained by the laser interferometers. The stretching ratio in the Y direction can be corrected by changing the magnification and the optical axis of the projection optical system. The determined orthogonality can be corrected by rotating the image projected by the individual projection optical system on the object plane, and shifting the optical axis of the projection optical system.

In this procedure, the optical axis of the projection optical system is changed in order to correct the stretching ratio in the Y direction because of the following reason. When the magnifications of the projection optical systems are changed in accordance with the stretching of the mask 2 or the photosensitive substrate 4, the positional relationships of overlap portions (portions shown by broken lines in FIG. 1) of the projected images (projection areas) P1 to P5 change, resulting in nonuniform exposure amounts for the photosensitive substrate 4. In order to obtain a uniform exposure amount over the entire substrate, it is necessary for the positional relationships between the projection areas to be returned to an initial state before the change of magnifications. The change in positional relationship among the plurality of projection areas, which may occur when the magnifications of the projection optical systems are changed in order to perform alignment for the mask 2 and the photosensitive substrate 4, will be explained with reference to FIGS. 9 and 10.

Figure 9:
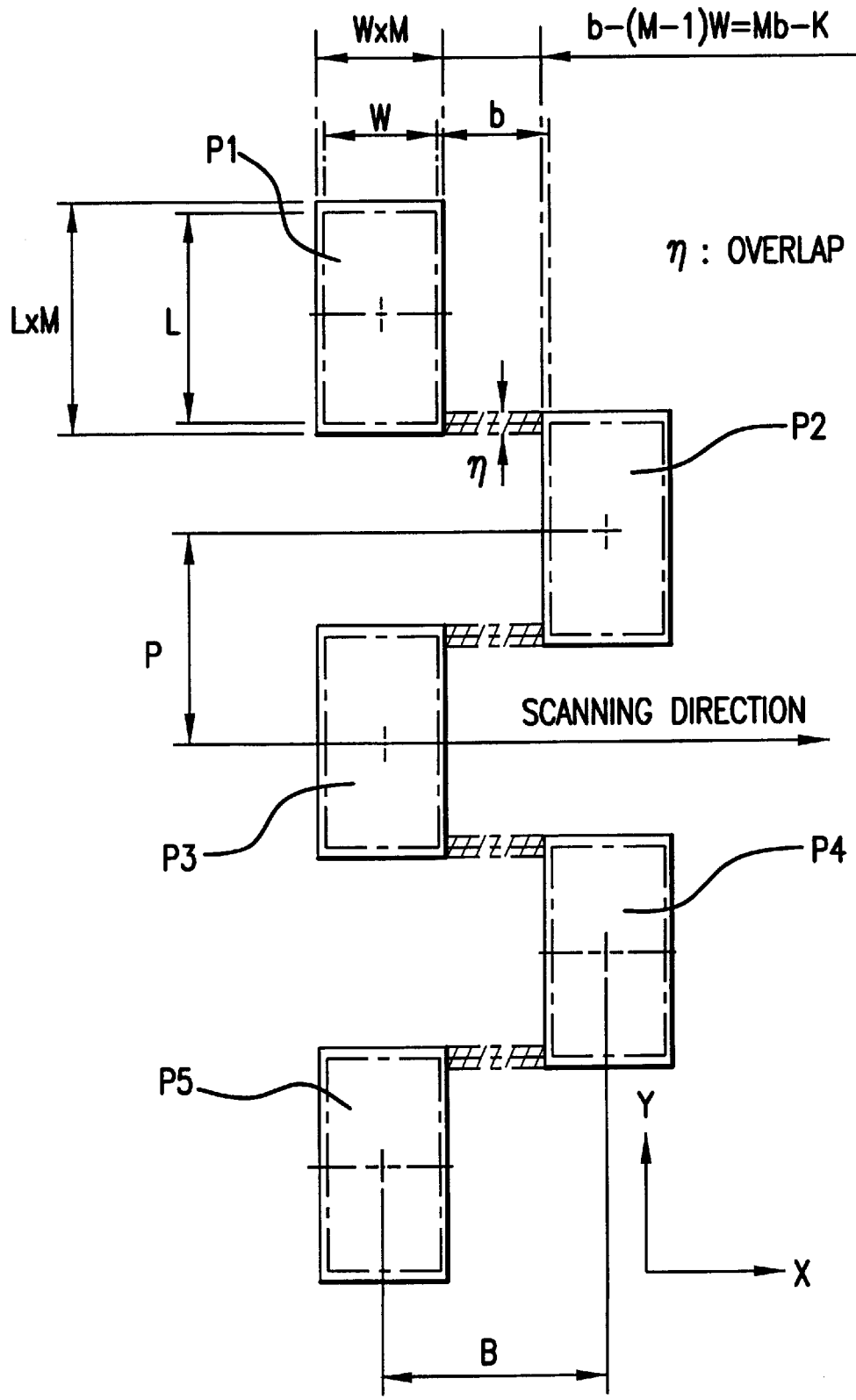
FIG. 9 illustrates a relationship between the change in magnification and the change in image position.
Figure 10A:
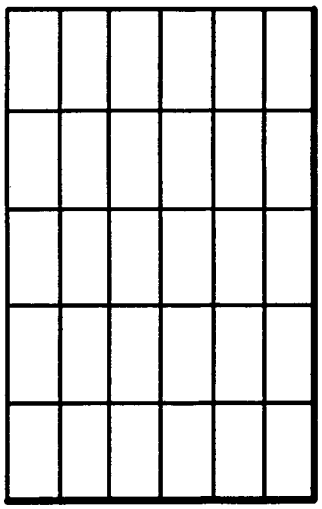
FIG. 10A shows a state of an image of a lattice-shaped pattern before changing the magnification.
Figure 10B:
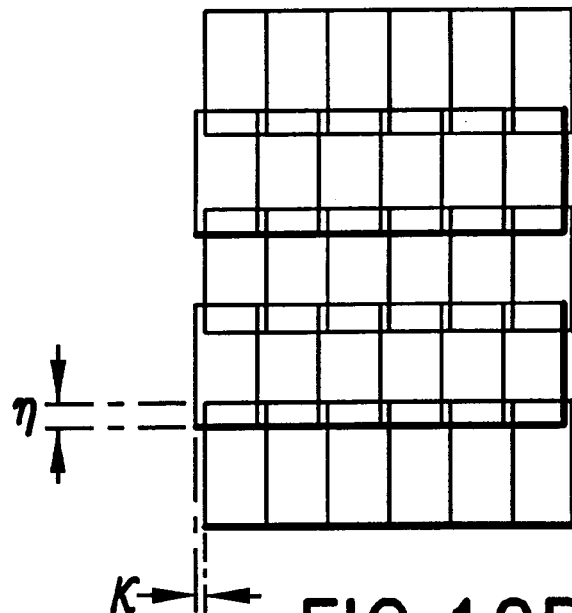
FIG. 10B shows a state of an image of the lattice-shaped pattern after changing the magnification.

In FIG. 9, the areas, which are indicated by two-dot chain lines, represent projection areas P1 to P5 obtained when the projection magnifications of the projection optical systems 3a to 3e are in an initial state. The areas, which are indicated by solid lines, represent projection areas obtained in a state in which the projection magnifications of the projection optical systems are changed. In order to simplify explanation, the projection areas have rectangular shapes, which are different from those shown in FIG. 1. When the initial magnifications are used, each of the projection areas has a length of L in the Y direction, and a length of W in the X direction. A spacing distance in the Y direction and a spacing distance in the X direction between centers of the respective projection areas (for example, between P1 and P2) are P and B respectively. In this state, there is no unnecessary overlap η in the Y direction between the adjacent projection areas. Similarly, the positional relationships in the X direction between the projection areas are also established in a predetermined state. Accordingly, when the entire plane of the mask 2 is subjected to scanning, a lattice-shaped pattern is accurately transferred as shown in FIG. 10A.

On the other hand, when the projection magnifications of the projection optical systems are changed to be M times the initial magnifications in accordance with the alignment for the mask and the photosensitive substrate described above, the length in the Y direction of the respective projection areas is L×M, and the length in the X direction is W×M. However, the spacing distances between the centers of the respective projection areas remain P and B. Therefore, the positional relationships between the respective projection areas are changed (for example, the spacing distance between longitudinal sides is changed from "b×" to "Mb−k" or "b−(M−1)W". An overlap η and a discrepancy k arise in the respective X, Y directions as represented by the following expressions:

$$\eta = M \times L - L = (M-1) \times L$$

$$k = M \times B - B = (M-1) \times B$$

Accordingly, the lattice-shaped pattern shown in FIG. 10A is transferred as an image containing the overlap η and the discrepancy k.

In order to correct the overlap η and the discrepancy k, the spacing distances between the respective projection areas can be changed in accordance with the change in magnifications of the projection optical systems. Basically, it is desirable to perform the correction such that the sizes of the projection areas and the spacing distances therebetween before the correction are similar to those after the correction. A method for correcting the overlap η will be explained with reference to FIG. 11.

Figure 11:
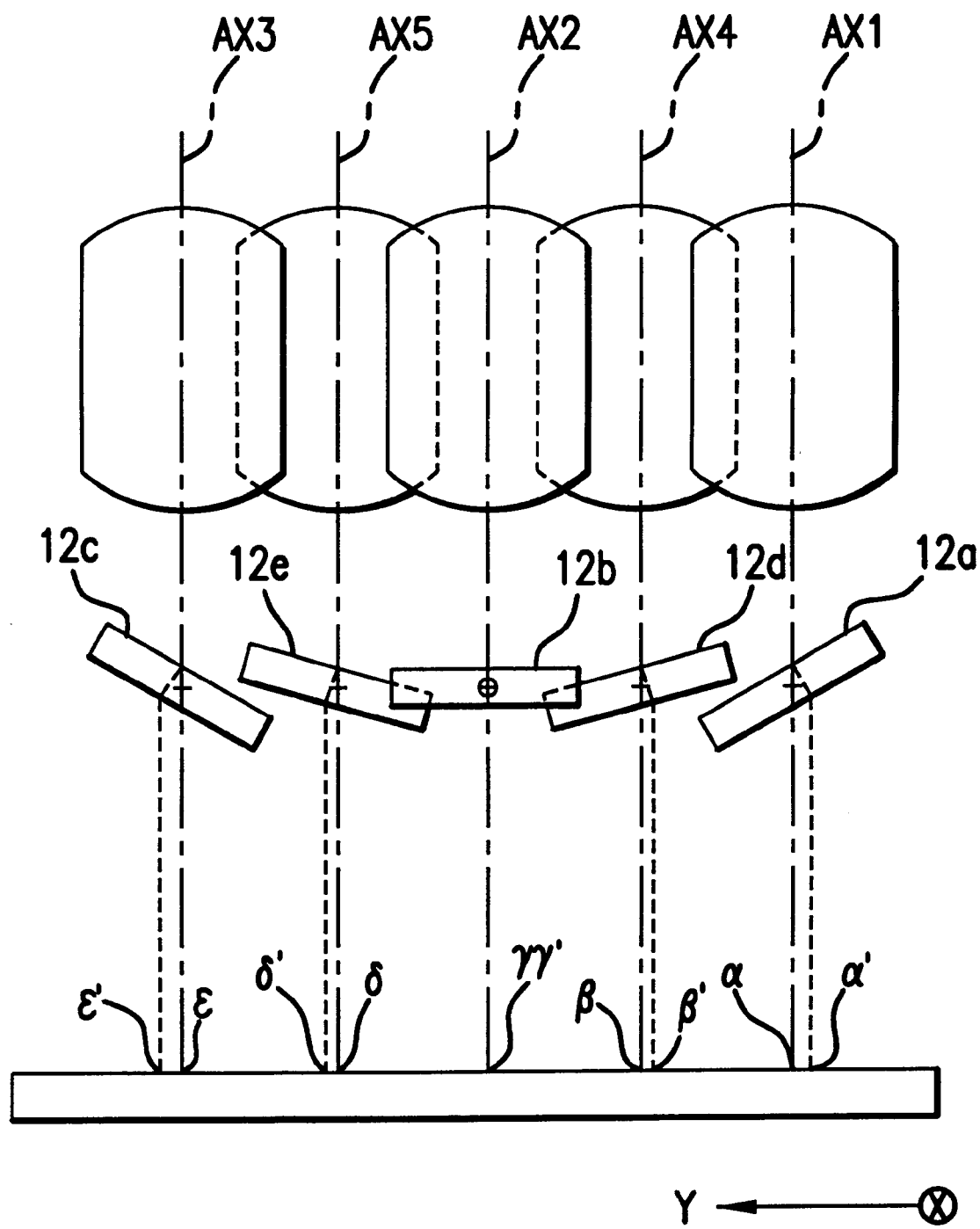
FIG. 11 shows a state of correction of optical axes corresponding to stretching of a photosensitive substrate.

FIG. 11 shows a state of correction of the optical axes corresponding to the stretching of the photosensitive substrate according to this embodiment. The respective parallel plane glass pieces 12a to 12e have a substantially identical thickness, which provide an identical amount of shift of the optical axes AX1 to AX5 when they are rotated by an identical angle of rotation. It is assumed that when the angle of rotation of each of the parallel plane glass pieces is 0°, the positions, at which the optical axes AX1 to AX5 are projected onto the photosensitive substrate 4, are α, γ, ε, β, 67. The positions α, γ, ε, β, δ are defined as positions at which the patterns are formed before the photosensitive substrate 4 is stretched.

Now a case will be considered, in which the photosensitive substrate 4 is uniformly expanded by Δp (ppm) in the Y direction. Namely, it is assumed that the positions α, γ, ε, β, δ of the previously formed patterns before the stretching of the photosensitive substrate 4 are displaced to positions α', γ', ε', β', δ' respectively due to the expansion of the photosensitive substrate. In this embodiment, the magnifications of the projection optical systems are changed in accordance with the stretching of the photosensitive substrate, and the optical axes are shifted in accordance with the amounts of change of the magnifications. Since the photosensitive substrate 4 is uniformly expanded, the amounts of displacement of the respective positions are proportional to distances from the center of the photosensitive substrate. Therefore, the amounts of shift of the optical axes are also proportional to the distances from the center of the photosensitive substrate. Namely, assuming that the spacing distance between the respective positions α, γ, ε, β, δ is L, the amounts of displacement of the respective positions, i.e., $|α'-α|$, $|β'-β|$, $|γ'-γ|$, $|δ'-δ|$, $|ε'-ε|$ are 2ΔL, ΔL, 0, ΔL, 2ΔL respectively. In addition, there is given $\Delta L = L \times \Delta p \times 10^{-6}$.

When the pattern are superimposed and formed on the expanded photosensitive substrate 4, the projection magnifications of the projection optical systems are enlarged by Δp (ppm) respectively. As a result, necessary amounts of shift of the optical axes are as follows. Namely, the amount of shift for the optical axes AX1, AX3 is represented by the following expression:

$$2\Delta L = 2L \times \Delta p \times 10^{-6}$$

On the other hand, the amount of shift for the optical axes AX4, AX5 is represented by the following expression:

$$\Delta L = L \times \Delta p \times 10^{-6}$$

Now it is assumed for the parallel plane glass piece that the angle (minute angle) of rotation is θ (rad), the thickness is t (mm), and the refractive index is n. The amount of shift of the optical axis ΔL (mm) caused by rotation of the parallel plane glass piece can be approximated by the following expression:

$$\Delta L = (L - L/n) t \theta$$

Accordingly, θ is approximated by the following expression:

$$\theta \approx L \cdot \Delta p \cdot n/(n-1)/t \times 10^{6}$$

The parallel plane glass pieces 12a, 12d, 12b, 12e, 12c are rotated by angles of rotation 2θ, θ, 0, −θ, −2θ respectively (the counterclockwise direction is positive). Thus the projection positions of the optical axes AX1, AX4, AX2, AX5, AX3 are allowed to coincide with the positions α', β', γ', δ', ε'. According to the foregoing operation, correction of the projected images (correction of the positions of image formation) can be performed in accordance with the expansion of the photosensitive substrate in the Y direction so that the overlap η does not occur. As for the discrepancy k, the parallel plane glass pieces 12b and 12d corresponding to projection areas P2 and P4 shown in FIG. 9 respectively or the parallel plane glass pieces 12a, 12c and 12e corresponding to projection areas P1, P3 and P4 shown FIG. 9 respectively may be rotated based on the k value. Also, the discrepancy k may be corrected by shifting the parallel plane glass pieces 12a, 12c and 12e and the parallel plane glass pieces 12b and 12d by k/2 in a direction which the parallel plane glass pieces 12a, 12c and 12e and the parallel plane glass pieces 12b and 12d separete each other.

Confirmation of Position of Image Formation for Each Projection Optical System

In this embodiment, the image formation characteristic of each of the projection optical systems is corrected by correcting the magnification, shifting the optical axis (shifting the projection position of the image), and rotating the image as described above. After that, it is confirmed, in accordance with the following operation, whether or not the image projected by each of the projection optical systems is formed at an appropriate position relative to the stretched substrate.

As explained in the foregoing section of "Calibration for Projection Optical Systems", the carriage 22 is set so that the measuring marks c' to h' on the fiducial mark plate 11 on the side of the photosensitive substrate may be observed at stitching portions in the first row of the projection optical systems, and the light beams are radiated by using the illuminating optical systems 3a to 3c. The mask stage 2A is scanned in the X, Y directions so that the measuring marks c to h on the movable mark plate 10B on the side of the mask pass across the measuring marks c' to h'. The light beams subjected to the scanning are monitored by the photoelectric detectors 13 to 15 provided under the fiducial mark plate 11 on the side of the photosensitive substrate. Predetermined signal processing is performed on the basis of the change in signal caused by overlap of the both marks. Thus the overlap centers for the both marks passed through the respective projection optical systems are determined. Measurement is performed for the other row of the projection optical systems in the same manner as described above.

Determination of the positional overlap centers of the both marks passed through the projection optical systems as described above makes it possible to determine the discrepancy amounts on the basis of the coordinate system concerning measurement by the interferometers. Coordinates of the images formed by the respective projection optical systems are also obtained on the basis of the coordinate system of the interferometer. Accordingly, it is possible to grasp the magnifications of the respective projection optical systems, the positions of the centers of the optical axes, and the rotations of the projected images. Therefore, it is possible to confirm whether or not the corrected magnifications, the controlled positions of the optical axes, the errors after rotation of the images, i.e., the positional discrepancy k and the overlap amount η between the images of the mutually adjacent segmental areas M1 to M5 (between P1 and P4, between P4 and P2, between P2 and P5, and between P5 and P3) are within predetermined allowable ranges.

As a result of the confirmation described above, if the positional discrepancy k and the overlap amount η between the images of the mutually adjacent segmental areas are not within the predetermined allowable ranges, at least any one of the correction of the magnifications, the control of the positions of the optical axes, and the rotation of the images is executed again.

In the confirmation described above, only a shift component common to the entire projection optical systems may remain as one to be subjected to control. It is noted that the information obtained by the measurement is a kind of information obtained by performing the scanning while managing the mask stage 2A by the aid of the interferometers. Accordingly, in such a case, the image formation characteristics of the projection optical systems may not be corrected. Instead, the shift component as described above may be corrected by combining it, as an offset, with a shift component resulting from the alignment.

As explained above, according to this embodiment, the positional discrepancy amounts as a result of the correction of the positional discrepancies are accurately detected by using the calibration system of the projection optical systems, i.e., the measuring marks on the movable mark plate 10B and the fiducial mark plate 11 installed on the carriage 22 of the projection exposure apparatus. Thus it is possible to confirm whether or not the correction of the positional discrepancies is sufficiently performed. As a result of the confirmation, if the correction is insufficient, at least one of the correction of the magnifications of the respective projection optical systems, the shift of the images (shift of the optical axes), and the rotation of the images projected onto photosensitive substrate by the respective projection optical systems is executed again so that the positional discrepancy amounts become sufficiently small. Accordingly, it is possible to accurately correct the positional discrepancies of the images of the segmental areas caused by at least the orthogonality error and the stretching of the substrate in the direction perpendicular to the scanning direction. This embodiment also provides an advantage that the correction of the magnifications of the respective projection optical systems can be confirmed by using the calibration system of the projection optical systems without newly providing another measuring means. It is also possible to perform confirmation by actually exposing the photosensitive substrate (test exposure), and observing an exposure pattern, without using any calibration system.

The change in magnification explained in the foregoing embodiment is principally caused by the stretching of the photosensitive substrate 4. It is considered that the amount of change is stable in an identical lot upon the use of the apparatus. Therefore, the measurement (calculation) for the magnification and the orthogonality described above may be carried out for a first sheet or a predetermined number of sheets of those contained in one lot. Only positional discrepancies (X, Y, θ) in the two-dimensional plane may be measured for the following sheets of photosensitive substrates. The measured positional discrepancies in the two-dimensional plane may be corrected to use, as the magnification and the orthogonality, those of the first sheet or average values obtained from the predetermined number of sheets to make correction thereof. By doing so, the measurement for alignment is remarkably simplified, and it is expected to improve the throughput. Alternatively, a technique is also conceived, in which an allowable value is set for the magnification, and the magnification is corrected only when the allowable value is exceeded.

As explained above, according to the method for correcting positional discrepancies of projected images in accordance with the present invention, it is possible to accurately correct positional discrepancies of respective projected images caused by deformation of the substrate, especially stretching of the substrate. Accordingly, it is possible to perform exposure while overlaying different patterns on an identical substrate with a high degree of accuracy.

Second Embodiment

Necessity to perform specified determination arises in the operation of "Calibration for Projection Optical Systems" in the first embodiment upon the use of the scanning type exposure apparatus 1 shown in FIG. 1. Namely, the overlap centers concerning the respective measuring marks on the movable mark plate 10B on the side of the mask and the respective measuring marks on the fiducial mark plate 11 on the side of the photosensitive substrate are required to be determined such that outputs from the photoelectric detectors 13 to 17 are allowed to correspond to positional information obtained by the three laser interferometers while scanning the mask stage 2A. This embodiment explains a signal-detecting and processing system which is preferably used to simultaneously detect positional information from the three laser interferometers and change in amount of transmitted light from the photoelectric detectors 13 to 17 concerning positions of the mask stage 2A having six axes in maximum.

In FIG. 1, only the interferometer beams $I_1$, $I_2$, $I_3$ of the laser interferometers are shown. However, a length-measuring interferometer is preferably used as the laser interferometer in the X direction represented by the interferometer beam $I_1$, (hereinafter referred to as "X interferometer"), while differential interferometers are preferably used as the laser interferometers in the Y direction represented by the interferometer beams $I_2$, $I_3$ (hereinafter referred to as "$Y_1$ interferometer" and "$Y_2$ interferometer").

Figure 12:
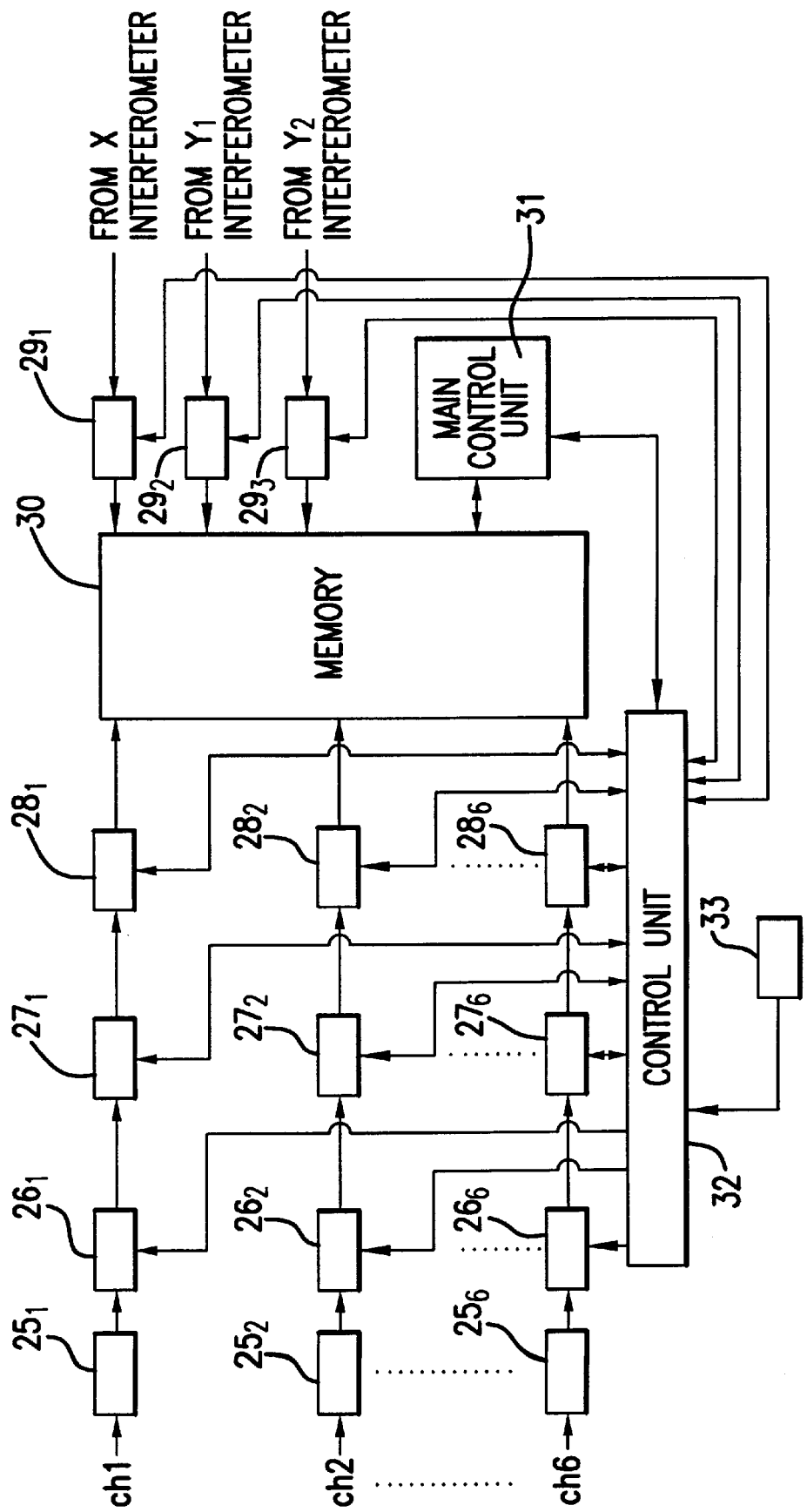
FIG. 12 shows a block diagram illustrating an arrangement of a signal-detecting and processing system as a principal section of a projection type exposure apparatus according to a second embodiment of the present invention.

FIG. 12 shows an example of the detecting and processing system. This detecting and processing system comprises six channels ch1 to ch6 provided corresponding to outputs from the photoelectric detectors 13 to 17 having six axes in maximum. Output lines of the X interferometer, the $Y_1$ interferometer, and the $Y_2$ interferometer are also connected to the detecting and processing system. The detecting and processing system comprises signal-shaping circuits $25_1$ to $25_6$, AGC (auto. gain control) circuits $26_1$ to $26_6$, A/D converters $27_1$ to $27_6$, first in first out memories (hereinafter referred to as "FIFO memories") $28_1$ to $28_6$ for constituting second storing means, FIFO memories $29_1$ to $29_3$ for constituting storing means, a memory 30, a main control unit 31, a control unit 32 under the control of the main control unit 31, and a clock signal generator 33.

The operation of the detecting and processing system will be explained. Each of the photoelectric detectors 13 to 15 has two signal output sections (two-divided detecting sections). The signal output sections of the photoelectric detectors 13 to 15 are six in total, from which signals corresponding to amounts of transmitted light (or change thereof) concerning the six axes are individually inputted into ch1 to ch6. The signals are subjected to signal shaping such as removal of noise by the signal-shaping circuits $25_1$ to $25_6$ respectively. Respective signals after the shaping are inputted into the AGC circuits $26_1$ to $26_6$. Gains are optimally adjusted by the AGC circuits $26_1$ to $26_6$ on the basis of gains and offsets given from the control unit 32. After that, A/D conversion is performed by the A/D converters $27_1$ to $27_6$ in synchronization with a clock signal to define constant time intervals given from the clock signal generator 33 through the control unit 32. After that, all digitized signals are once stored in the FIFO memories $28_1$ to $28_6$.

The respective signals from the photoelectric detectors are A/D-converted and incorporated into the FIFO memories $28_1$ to $28_6$ in synchronization with the clock signal which is generated by the clock generator 33 and defines the constant time intervals as described above. The three pieces of positional information from the X interferometer, the $Y_1$ interferometer, and the $Y_2$ interferometer are also incorporated into the FIFO memories $29_1$ to $29_3$ in synchronization with the clock signal by the aid of the control unit 32.

All of the operations of the detecting and processing system as described above are performed in real-time during scanning of the mask stage 2A. Commands to the AGC circuits $26_1$ to $26_6$, the A/D converters $27_1$ to $27_6$, and other components are generated by the control unit 32 on the basis of commands from the main control unit 31.

After that, the main control unit 31 successively incorporates, at an arbitrary time, the information stored in the FIFO memories $28_1$ to $28_6$ and the positional information from the laser interferometers incorporated into the FIFO memories $29_1$ to $29_3$ into the memory 30 which is directly accessible for the main control unit 31 itself. Thus the main control unit 31 performs necessary signal processing. More specifically, CPU in the main control unit 31 calculates image formation characteristics of the projection optical systems (discrepancy amounts of images projected by the projection optical systems) on the basis of the positional information and the photoelectric signals corresponding to the positional information. In this embodiment, the following control algorithm is adopted. Namely, CPU in the main control unit 31 determines the position of the mask stage 2A on the basis of the three pieces of positional information stored in the FIFO memories $29_1$ to $29_3$ at an identical sampling timing. Discrepancy amounts of images projected through the respective projection optical systems 5 to 9 are determined on the basis of the determined position of the mask stage 2A and the photoelectric signals stored in the FIFO memories $28_1$ to $28_6$ at the same sampling timing as that described above.

Next, a method for determining discrepancy amounts of images projected through the respective projection optical systems 5 to 9 will be specifically explained.

Figure 13A:
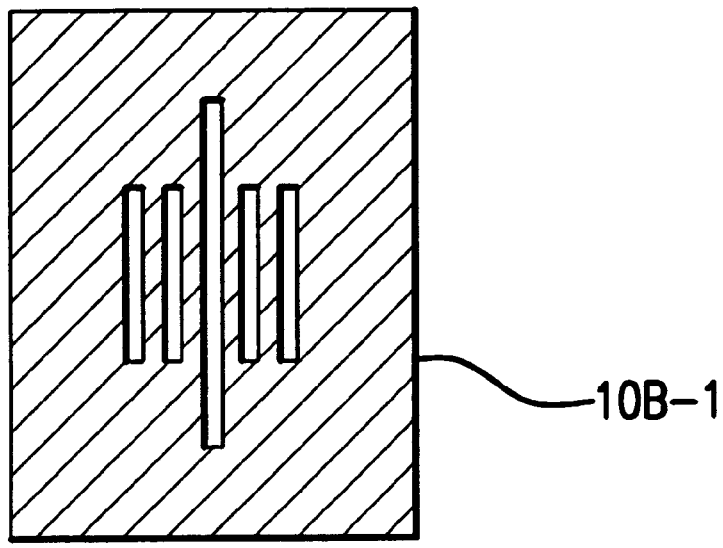
FIG. 13A exemplarily shows a measuring mark used to measure a discrepancy amount, illustrating the mark for measurement in the X direction, formed on a movable mark plate disposed on a side of a mask.
Figure 13B:
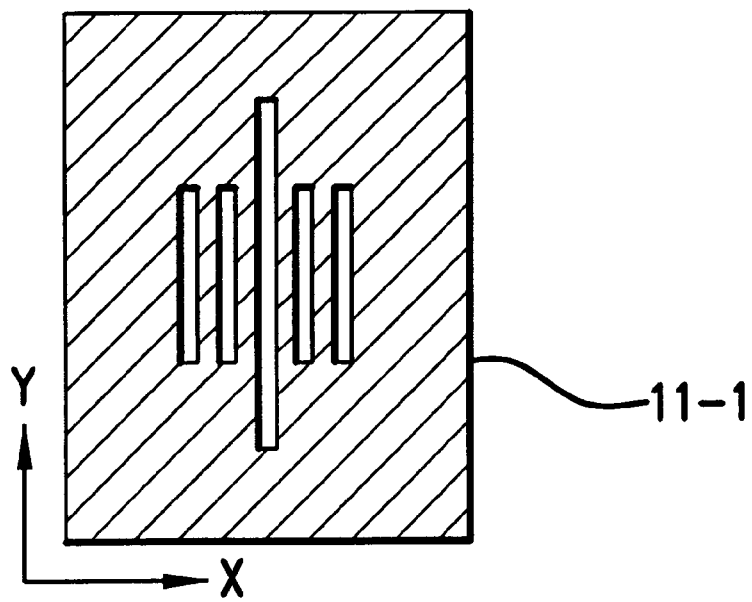
FIG. 13B exemplarily shows a measuring mark used to measure a discrepancy amount, illustrating the mark for measurement in the X direction, formed on a fiducial mark plate disposed on a side of a photosensitive substrate.

FIG. 13 exemplarily shows measuring marks used to measure the discrepancy amounts described above. Specifically, FIG. 13A shows a measuring mark 10B-1 for measurement in the X direction provided in the respective measuring marks c to h on the movable mark plate 10B on the side of the mask, and FIG. 13B shows a measuring mark 11-1 for measurement in the X direction provided in the respective measuring marks c' to h' on the fiducial mark plate 11 on the side of the photosensitive substrate. The marks 10B-1, 11-1 are grating marks in each of which an aperture pattern comprising light-transmitting sections extending in the Y direction at a predetermined spacing distance is formed in the X direction on an inner area of a shielding film composed of, for example, chromium (Cr) shown by hatched portions in FIG. 13. In this embodiment, a central aperture pattern is longer than other patterns. Accordingly, when the both marks 10B-1, 11-1 are overlapped with each other, the amount of transmitted light coming into the photoelectric detectors 13 to 17 is especially increased.

Figure 14:
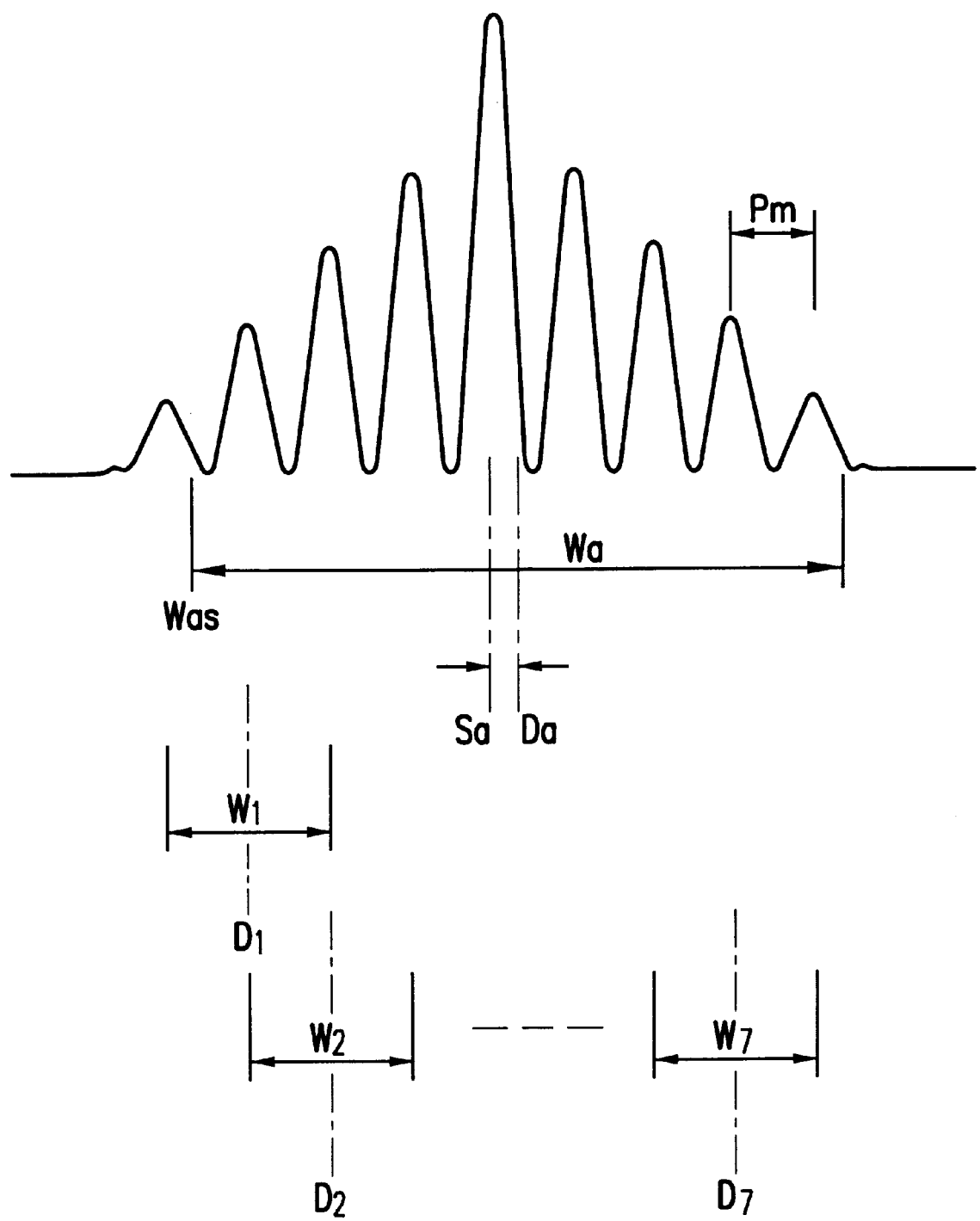
FIG. 14 shows a diagram illustrating a waveform of a photoelectric signal which represents the change in amount of transmitted light received by a photoelectric detector during scanning for a mask stage to measure a discrepancy amount.

FIG. 14 shows a waveform of a photoelectric signal illustrating the change in amount of transmitted light received by the photoelectric detectors 13 to 15 or the photoelectric detectors 16, 17 when the mask stage 2A, to which the movable mark plate 10B on the side of the mask is attached, is relatively scanned so that the measuring mark 10B-1 on the side of the mask covers the entire area of the measuring mark 11-1 on the side of the photosensitive substrate, in the projection type exposure apparatus 1 according to this embodiment.

In FIG. 14, a symbol Sa indicates a mark center as a position at which the both measuring marks 10B-1, 11-1 are completely overlapped with each other. A distance from a scanning start position for the mask stage 2A to the mark center Sa is a result to be determined.

Next, a method for determining the mark center Sa will be explained more specifically. The signal waveform shown in FIG. 14 represents those obtained as follows. Namely, signals are photoelectrically converted by the photoelectric detectors 13 to 17, and subjected to smoothing processing by the aid of the signal-processing circuits $25_1$ to $25_6$ as described above, if necessary, to remove any noise, followed by A/D conversion by the A/D converter $27_1$ to $27_6$ at constant time intervals on the basis of a predetermined sampling clock to be stored in the FIFO memories $28_1$ to $28_6$. It is noted that results of measurement performed by the X, $Y_1$, $Y_2$ interferometers are also stored in the FIFO memories $29_1$, $29_2$, $29_3$ simultaneously with the photoelectrically converted signals on the basis of the sampling clock described above. Accordingly, it is possible to consequently convert and correct the result on time base as a result based on the position.

The foregoing respective signals are incorporated into the memory by the aid of CPU in the main control unit 31 so that the mark center Sa is determined in accordance with a technique described below. Namely, according to an expression of definition of Fourier transform, there is given:

$$X(\omega) = \int_{-\infty}^{\infty} x(t) e^{-j\omega t} dt \qquad (1)$$

-continued $$= \int_{-\infty}^{\infty} x(t)\cos\omega t + j \int_{-\infty}^{\infty} x(t)(-\sin\omega t) dt$$

wherein x(t) represents a signal waveform which is a function of time, and ω represents an angular frequency (circular frequency).

Now it is assumed that a real part of the first term in the foregoing expression is R, and an imaginary part of the second term is I. A phase angle (positional discrepancy angle) can be determined in accordance with the following expression:

$$\theta = \tan^{-1}(I/R) \quad (2)$$

Although a form of infinite integration is given in the expression (1), definite integration is performed in a range of Wa including the signal waveform as a processing range, in actual software processing.

In this procedure, the processing start position Was and the processing range Wa are determined on the basis of the following expressions:

$$\text{Was} = \text{Da} - \{(\text{Mn}-1)/2\} \times \text{Pm} \quad (3)$$

$$\text{Wa} = (\text{Mn}-1) \times \text{Pm} \quad (4)$$

wherein Da represents a designed position at which the both marks 10B-1, 11-1 are completely overlapped with each other, Mn represents a number of marks to be processed, and Pm represents a mark pitch. The processing range shown in FIG. 14 corresponds to a number of marks of 9.

The phase angle θ in the expression (2) gives, as an angle, a degree of discrepancy of the designed value Da from the mark center Sa. Therefore, the ratio of the discrepancy amount Ea of the mark center Sa from the designed value Da to the mark pitch Pm should be coincident with θ/2π. Inversely speaking, this fact means that the discrepancy amount Ea can be determined easily and certainly on the basis of the phase angle θ and the mark pitch Pm.

The main control unit 31 corrects the discrepancy amount Ea on the basis of the positional information from the laser interferometers described above. The scanning start position of the mask stage 2A is added to the corrected discrepancy amount Ea to obtain a final result.

In this procedure, the phase angle θ is determined with the use of arctangent. Accordingly, in principle, an accurate value cannot be determined if the mark center Sa is discrepant with the designed value Da by not less than ±½ mark pitch. For this reason, in this embodiment, such a problem is avoided by roughly determining a central position of a mark having a maximum amplitude from the waveform beforehand, and regarding an obtained result as the designed value Da.

The foregoing explanation has exemplified the case in which the processing range Wa is an entire signal. However, for example, the signal may be appropriately divided, on time base, into W1, W2, . . . W7 as shown in FIG. 14 to determine mark centers for respective divided areas in accordance with the same technique as described above so that positions of mark centers of the respective divided areas are simply averaged or averaged with weights depending on signal intensities. Thus a true mark center Sa may be determined. In such a procedure, it is necessary to previously determine designed values of the respective marks, i.e., mark centers D1, D2, . . . D7 of the respective divided areas (see FIG. 14) from the mark pitch Pm and the central position Da of the mark having the maximum amplitude having been roughly determined beforehand as described above.

As explained above, when the positional discrepancy of the projected image of the first reference mark is determined, the respective photoelectric signals, which are stored in the storing means in synchronization with the clock signal to define the constant time intervals, are appropriately divided to perform the Fourier transform. Accordingly, the mark center of each of the divided areas can be mechanically determined without substantially being affected by any noise or the like, on the basis of the designed value and the phase angle for each of the divided areas determined based on the arctangent of the real part and the imaginary part obtained by the Fourier transform. The true position of the mark center is determined by simply averaging the positional data on the mark centers of the respective divided areas or averaging them with weights corresponding to signal intensities. Thus the position of the mark center can be accurately determined. The discrepancy amount Ea, which is the difference between the true position of the mark center and the designed value, is stored in the FIFO memories $29_1$ to $29_3$ simultaneously with the photoelectric signal in synchronization with the clock signal to define the constant time intervals. The positional information incorporated into the memory 30 is used and converted into the positional discrepancy amount of the projected image. Thus the positional discrepancy of the projected image can be determined with a high degree of accuracy.

In this embodiment, when the data on the position of the mark center of each of the divided areas is determined on the basis of the weighted average corresponding to the signal intensities, the weighted average is determined such that a larger weight is given to data on the position of the mark center for a divided area having a large signal intensity, and a smaller weight is given to data on the position of the mark center for a divided area having a small signal intensity. Thus the true position of the mark center can be determined with a higher degree of accuracy as compared with the case of simple average. Consequently the positional discrepancy of the projected image can be determined with a higher degree of accuracy.

Another procedure may be available. Namely, each of the waves of the signal waveforms (corresponding to each of the grating patterns) is sliced at respective predetermined levels within a range from a minimum amplitude to a maximum amplitude. Centers of line segments defined by intersections between the slice levels and curves of the waves on right and left sides are determined for the plurality of slice levels respectively. Obtained results are simply averaged or averaged with weights to determine mark centers for the respective waves. Data on the positions of the mark centers are simply averaged or averaged with weights so that the mark center Sa is determined. In this procedure, it is also premised for calculation of the discrepancy amount that the designed values D1, D2, . . . D7 of the respective marks are previously determined.

In this embodiment, the following procedure may be available to determine the true position Sa of the mark center. Namely, widths (W1, W2, . . . W7) of windows, which determine the divided areas, are changed for the respective time-based divided areas depending on a velocity of the mask stage 2A obtained on the basis of the positional information. By doing so, it is not necessarily indispensable for the mask stage 2A to be moved at a uniform velocity in order to incorporate signals. Signals can be incorporated even during acceleration or deceleration. Accordingly, it is possible to shorten the time required to determine the image formation characteristic of the projection optical system.

In the foregoing description, only the measurement in the X direction has been explained. However, it is needless to say that the discrepancy amount can be also determined in the Y direction in the same manner as described above.

In accordance with the method as described above, the optical axis-adjusting mechanisms 12a to 12e and the magnification-adjusting mechanisms for the respective projection optical systems are adjusted so that determined results concerning each of the projection optical systems 5 to 7 or the projection optical systems 8, 9 are equalized. Thus the correction is performed so that the continuity of the projected images is optimized. However, in principle, the projection optical systems 5, 7 are not subjected to the correction in this step because they have been previously subjected to the calibration. Those other than the projection optical systems 5, 7 are subjected to the correction.

As clarified from the foregoing explanation, the storage control means and the second storage control means are constructed by the control unit 32, and the computing means is constructed by the main control unit 31 in this embodiment.

As explained above, according to this embodiment, all pieces of information are subjected to sampling by using the constant timing that is time. Thus a relatively simple arrangement of hardware can be achieved, which scarcely requires adjustment. Moreover, signal processing based on software makes it possible to greatly improve the accuracy.

Further, the FIFO memories are allowed to intervene on the way of the process. Accordingly, provision of CPU or CPU's of a number which is smaller than a number of process axes is enough to construct the main control unit 31. Moreover, it is unnecessary to perform signal processing in real-time. Accordingly, CPU having a low operating clock is sufficiently usable. Thus the cost can be decreased also from the viewpoint of peripheral circuits.

When the number of axes (number of channels) subjected to measurement is increased, it is sufficient to only increase the number of systems ranging from the signal-shaping circuit 25 to the FIFO memory 28. Thus it is easy to perform extension.

In the foregoing embodiment, the case has been exemplified, in which the storage control means and the second storage control means are constructed by the control unit 32. However, the present invention is not limited thereto. It is allowable that the storage control means and the second storage control means may be constructed by separate hardwares.

In the foregoing embodiment, the case has been exemplified, in which the clock-generating section is constructed by the timing signal-generating circuit for generating the sampling clock at the constant time intervals. However, the present invention is not limited thereto. Instead of such an arrangement, the following arrangement may be available. Namely, a length-measuring type laser interferometer (position sensor for measuring change in position in a principle axis direction) is provided for measuring change in position in the scanning direction during scanning at a constant velocity for the mask stage 2A. Signals (for example, pulse signals), which are outputted from the laser interferometer at constant time intervals in accordance with constant velocity base change in measured value obtained by the length-measuring type laser interferometer, are inputted into the control unit 32 as the sampling clock. In such an arrangement, the operation is performed in accordance with the timing of input of the pulse signal in response to a command from the main control unit 31 by the aid of the control unit 32 so that signals corresponding to amounts of transmitted light concerning six axes, inputted into the signal-shaping circuits 25 from the photoelectric detectors 13 to 15, and output signals from the remaining laser interferometers are A/D-converted, and they are simultaneously incorporated into the FIFO memories.

The foregoing embodiment adopts the technique of so-called time synchronization in which the respective signals are simultaneously incorporated at an identical timing. Accordingly, it is also possible to cope with a case in which the principle axis is expressed by a sum, a difference, or an indirect value obtained by any processing such as averaging, of those concerning a plurality of measuring units.

The present invention may be practiced or embodied in other various forms without departing from the spirit or essential characteristics thereof. It will be understood that the scope of the present invention is indicated by the appended claims, and all variations and modifications concerning, for example, the way of construction of the storage control means and the second storage means, the way of generation of the sampling clock, and the way of expression of the principle axis, which come within the equivalent range of the claims, are embraced in the scope of the present invention.

What is claimed is:

1. A method for correcting positional discrepancies of images projected onto exposure areas on a substrate, which is used when the substrate is exposed with an entire plane of a pattern area on a mask by illuminating different segmental areas of the pattern area on the mask respectively, projecting images of the respective segmental areas onto the exposure areas on the substrate through a plurality of projection optical systems provided corresponding to the different segmental areas, and moving the mask and the substrate with respect to the projection optical systems in a predetermined scanning direction at a velocity ratio corresponding to projection magnifications of the projection optical systems, the method comprising:

a first step of detecting amounts of deformation of the substrate including at least an amount of stretching of the substrate in a direction perpendicular to the scanning direction based on a positional relationship between an alignment mark on the mask and an alignment mark on the substrate;

a second step of executing correction of the projection magnifications of the respective projection optical systems and shift of the images projected onto the substrate through the respective projection optical systems, on the basis of a result of detection obtained in the first step;

a third step of confirming whether or not positional discrepancies and overlap amounts between images of mutually adjacent segmental areas of the images of the respective segmental areas projected onto the substrate are within predetermined allowable ranges; and a fourth step of again executing, if the positional discrepancies and the overlap amounts are not within the allowable ranges, at least one of correction of the projection magnifications of the respective projection optical systems and shift of the images projected onto the substrate through the respective projection optical systems so that both of the positional discrepancies and the overlap amounts are within the allowable ranges.

2. The method according to claim 1, wherein before the first step, each of the projection optical systems is subjected to calibration for a position of image formation on the basis of a set of reference marks arranged at positions conjugate to one another in relation to the projection optical system respectively, and in the third step, it is confirmed whether or not the positional discrepancies and the overlap amounts between the images of the mutually adjacent segmental areas projected onto the substrate are within the predetermined allowable ranges, by using the set of reference marks arranged at the positions conjugate to one another in relation to the projection optical system.

3. The method according to claim 1, wherein in the second step, the projected images are shifted in the direction perpendicular to the scanning direction by changing optical paths of light beams radiated from the respective projection optical systems.

4. The method according to claim 3, wherein the projected images are shifted in the direction perpendicular to the scanning direction by arranging light-transmissive plane plates on the optical paths between the respective projection optical systems and the substrate, and inclining the plane plates with respect to optical axes of the projection optical systems.

5. The method according to claim 1, wherein in the first step, a difference in position between the alignment mark on the mask and the alignment mark on the substrate corresponding thereto is detected, and the amounts of deformation of the substrate including at least the amount of stretching of the substrate in the direction perpendicular to the scanning direction are detected on the basis of the difference in position.

6. The method according to claim 1, wherein the projection magnification is 1× magnification, and the mask and the substrate are held and moved on an identical carriage.

7. The method according to claim 2, wherein at least one of the set of reference marks is arranged at a position adjacent to the pattern area on the mask.

8. The method according to claim 2, wherein at least one of the set of reference marks is arranged on a mask stage for holding the mask thereon.

9. The method according to claim 2, wherein at least one of the set of reference marks is arranged on a carriage for moving with respect to the plurality of projection optical systems.

10. A method for correcting positional discrepancies of projected images projected onto exposure areas on a substrate, which is used when the substrate is exposed with an entire plane of a pattern area on a mask by illuminating different segmental areas of the pattern area on the mask respectively, projecting images of the respective segmental areas onto the exposure areas on the substrate through a plurality of projection optical systems provided corresponding to the different segmental areas, and moving the mask and the substrate with respect to the projection optical systems in a predetermined scanning direction at a velocity ratio corresponding to projection magnifications of the projection optical systems, the method comprising:

a first step of detecting amounts of deformation of the substrate including at least an amount of stretching and an orthogonality error of the substrate in a direction perpendicular to the scanning direction on the basis of a positional relationship between an alignment mark on the mask and an alignment mark on the substrate;

a second step of executing correction of the projection magnifications of the respective projection optical systems and shift and rotation of the projected images projected onto the substrate through the respective projection optical systems, based on a result of detection obtained in the first step;

a third step of confirming whether or not positional discrepancies and overlap amounts between images of mutually adjacent segmental areas of the images of the respective segmental areas projected onto the exposure areas on the substrate are within predetermined allowable ranges; and a fourth step of again executing, if the positional discrepancies and the overlap amounts are not within the allowable ranges, at least any one of correction of the projection magnifications of the respective projection optical systems and shift and rotation of the projected images projected onto the substrate through the respective projection optical systems so that both of the positional discrepancies and the overlap amounts are within the allowable ranges.

11. The method according to claim 10, wherein before the first step, each of the projection optical systems is subjected to calibration for a position of image formation on the basis of a set of reference marks arranged at positions conjugate to one another in relation to the projection optical system respectively, and in the third step, it is confirmed whether or not the positional discrepancies and the overlap amounts between the images of the mutually adjacent segmental areas projected onto the substrate are within the predetermined allowable ranges, by using the set of reference marks arranged at the positions conjugate to one another in relation to the projection optical system.

12. The method according to claim 10, wherein in the second step, the projected images are shifted in the direction perpendicular to the scanning direction by changing optical paths of light beams radiated from the respective projection optical systems.

13. The method according to claim 12, wherein the projected images are shifted in the direction perpendicular to the scanning direction by arranging light-transmissive plane plates on the optical paths between the respective projection optical systems and the substrate, and including the plane plates with respect to optical axes of the projection optical systems.

14. The method according to claim 10, wherein in the first step, a difference in position between the alignment mark on the mask and the alignment mark on the substrate corresponding thereto is detected, and the amounts of deformation of the substrate including at least the amount of stretching of the substrate in the direction perpendicular to the scanning direction are detected on the basis of the difference in position.

15. The method according to claim 10, wherein the projection magnification is 1× magnification, and the mask and the substrate are held and moved on an identical carriage.

* * * * *

UNITED STATES PATENT AND TRADEMARK OFFICE
CERTIFICATE OF CORRECTION

PATENT NO.    : 5,999,244
DATED         : December 7, 1999
INVENTOR(S)   : Masamitsu YANAGIHARA et al.

It is certified that error appears in the above-identified patent and that said Letters Patent is hereby corrected as shown below:

On the title page, item

[75] Inventors: Masamitsu Yanagihara, Zama; Kei Nara; Seiji Miyazaki, both of Yokohama, all of Japan.

Signed and Sealed this

Fourteenth Day of November, 2000

Attest:

Q. TODD DICKINSON

*Attesting Officer*  *Director of Patents and Trademarks*